United States Patent
Kubo et al.

(10) Patent No.: US 9,669,510 B2
(45) Date of Patent: Jun. 6, 2017

(54) POLISHING CLEANING MECHANISM, SUBSTRATE PROCESSING APPARATUS, AND SUBSTRATE PROCESSING METHOD

(71) Applicant: TOKYO ELECTRON LIMITED, Tokyo (JP)

(72) Inventors: Akihiro Kubo, Koshi (JP); Masahiro Fukuda, Koshi (JP); Taro Yamamoto, Koshi (JP); Kenji Yada, Koshi (JP); Masashi Enomoto, Koshi (JP); Noboru Nakashima, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 31 days.

(21) Appl. No.: 14/533,133

(22) Filed: Nov. 5, 2014

(65) Prior Publication Data
US 2015/0133032 A1 May 14, 2015

(30) Foreign Application Priority Data

Nov. 13, 2013 (JP) .................................. 2013-234788
May 29, 2014 (JP) .................................. 2014-110836

(51) Int. Cl.
*B24B 27/00* (2006.01)
*B24B 37/005* (2012.01)
(Continued)

(52) U.S. Cl.
CPC ........ *B24B 37/005* (2013.01); *B24B 27/0061* (2013.01); *B24B 37/34* (2013.01);
(Continued)

(58) Field of Classification Search
CPC ... B24B 25/00; B24B 27/0061; B24B 37/005; B24B 49/16; B24D 7/14; B24D 7/18; B24D 11/04; B24D 13/147
See application file for complete search history.

(56) References Cited

U.S. PATENT DOCUMENTS 2,309,016 A * 1/1943 Ryan ........................ B24D 7/14
451/548
5,389,032 A * 2/1995 Beardsley ................ B24D 7/14
451/359
(Continued)

FOREIGN PATENT DOCUMENTS

JP 11-135463 A 5/1999
JP 2003340718 A 2/2003
(Continued)

*Primary Examiner* — Timothy V Eley
(74) *Attorney, Agent, or Firm* — Nath, Goldberg & Meyer; Jerald L. Meyer

(57) ABSTRACT

There is disclosed a polishing cleaning mechanism configured to be in contact with a rear surface of a substrate which is held in a substrate holding unit for holding the rear surface of the substrate and perform a polishing process and a cleaning process on the rear surface of the substrate, including a cleaning member configured to clean the rear surface of the substrate, a polishing member configured to polish the rear surface of the substrate, and a support member configured to support the polishing member and the cleaning member to face the rear surface of the substrate held in the substrate holding unit, wherein a surface of the polishing member facing the substrate and a surface of the cleaning member facing the substrate differ in relative height from each other.

9 Claims, 18 Drawing Sheets

(51) Int. Cl.
B24B 37/34 (2012.01)
B24B 47/16 (2006.01)
B24B 25/00 (2006.01)
B24D 7/18 (2006.01)

(52) U.S. Cl.
CPC .............. B24B 47/16 (2013.01); *B24B 25/00* (2013.01); *B24D 7/18* (2013.01)

(56) References Cited

U.S. PATENT DOCUMENTS

| | | | | |
|---|---|---|---|---|
| 5,503,592 A * | 4/1996 | Neumann | ................ | B24D 7/14 451/278 |
| 5,951,380 A * | 9/1999 | Kim | ................ | B24B 37/26 451/288 |
| 6,386,956 B1 * | 5/2002 | Sato | ................ | B24B 27/0076 451/57 |
| 6,722,962 B1 * | 4/2004 | Sato | ................ | B24B 37/04 451/259 |
| 7,014,540 B2 * | 3/2006 | Nagel | ................ | B24B 7/16 451/268 |
| 7,481,695 B2 * | 1/2009 | Saldana | ................ | B24B 37/20 451/285 |
| 7,604,530 B2 * | 10/2009 | Shih | ................ | B24B 37/22 451/527 |
| 7,824,245 B2 * | 11/2010 | Crocco | ................ | B24B 37/005 451/288 |
| 9,089,943 B2 * | 7/2015 | Lipson | ................ | B24D 7/18 |
| 2003/0190875 A1 * | 10/2003 | Grabbe | ................ | B24B 19/226 451/65 |
| 2005/0173377 A1 * | 8/2005 | Pietsch | ................ | B24B 7/17 216/88 |
| 2007/0032177 A1 * | 2/2007 | Park | ................ | B24B 7/228 451/57 |
| 2015/0367475 A1 * | 12/2015 | Wei | ................ | B24B 7/228 451/41 |

FOREIGN PATENT DOCUMENTS

| | | |
|---|---|---|
| JP | 2008-135583 A | 6/2008 |
| JP | 2012-023209 A | 2/2012 |
| JP | 2012020393 A | 2/2012 |

* cited by examiner

POLISHING CLEANING MECHANISM, SUBSTRATE PROCESSING APPARATUS, AND SUBSTRATE PROCESSING METHOD

CROSS-REFERENCE TO RELATED APPLICATION

This application claims the benefit of Japanese Patent Application Nos. 2013-234788 and 2014-110836, filed on Nov. 13, 2013 and May 29, 2014, in the Japan Patent Office, the disclosure of which is incorporated herein in their entirety by reference.

TECHNICAL FIELD

The present disclosure relates to a polishing cleaning mechanism for polishing and cleaning, for example, a rear surface of a substrate, and a substrate processing apparatus and a substrate processing method provided with the polishing cleaning mechanism.

BACKGROUND

For example, in a photolithography process of a semiconductor device manufacturing method, a series of processes such as a resist application process for forming a resist film by applying a resist solution onto a wafer, an exposure process for exposing the resist film into a specified pattern, and a developing process for developing the exposed resist film is performed one after another to form a specified resist pattern on the wafer. The series of processes is performed by an application development system as a substrate processing system in which various kinds of processing units for processing the wafer and transfer units for transferring the wafer are installed.

In recent years, a circuit pattern formed on a wafer has been miniaturized and a defocus at the time of exposure has become more stringent. One of the causes for defocus includes, for example, adherence of particles to a stage of an exposure device. A major cause for generation of these particles is that the particles adhere to, particularly, a rear surface of a wafer transferred into the exposure device. For the above reason, prior to transferring the wafer into the exposure device, the rear surface of the wafer may be cleaned by a cleaning device installed within an application development system.

In the cleaning device, cleaning is performed by moving a brush pressed against the rear surface of the wafer while the rear surface of the wafer faces downward, for example, by attracting and holding the rear surface of the wafer.

In some cases, unevenness due to flaws and the like generated on the rear surface of the wafer may be a cause of defocus. Therefore, prior to transferring the wafer into the exposure device, the rear surface of the wafer may be polished by a polishing device as will be described below.

In the polishing device, polishing is performed by pressing a polishing pad against the wafer while supplying a polishing liquid to the wafer. The polishing pad is then retreated from above the wafer and a cleaning brush is moved onto the wafer. In order to remove polishing sludge or the like from the wafer, the wafer is cleaned by the cleaning brush while supplying a cleaning liquid.

Since the throughput in a photolithography process is typically dominated by the throughput of an exposure device, a throughput of the above described cleaning device and the like is required to be higher than that of the exposure device. However, the throughput of a typical cleaning device or a typical polishing device may be lower than that of the exposure device. Thus, for example, for one exposure device, a plurality of cleaning devices and the like may be installed within an application development system.

In addition, from the viewpoint of the running cost and the like of a clean room, the footprint of the application development system is required to be set as small as possible. Thus, a space for installation of a cleaning device or a polishing device may not be necessarily sufficient in the application development system. Thus, the polishing process or the cleaning process may be a bottleneck.

In this case, the polishing pad for the polishing process and the cleaning brush for the cleaning process may be installed within one device. In that case, however, controlling an arm for operating the polishing pad and an arm for operating the cleaning brush becomes complex. In addition, since drive devices for operating the arms are installed individually, the space required to install the drives devices becomes larger. Thus, space saving is not sufficient.

SUMMARY

The present disclosure provides a polishing cleaning mechanism, a substrate processing apparatus, and a substrate processing method for efficiently performing a polishing process and cleaning process on a wafer.

According to an aspect of the present disclosure, there is provided a polishing cleaning mechanism configured to be in contact with a rear surface of a substrate which is held in a substrate holding unit for holding the rear surface of the substrate and perform a polishing process and a cleaning process on the rear surface of the substrate, which includes: a polishing member configured to polish the rear surface of the substrate; a cleaning member configured to clean the rear surface of the substrate; and a support member configured to support the polishing member and the cleaning member to face the rear surface of the substrate held in the substrate holding unit, wherein a surface of the polishing member facing the substrate and a surface of the cleaning member facing the substrate differ in relative height from each other.

According to another aspect of the present disclosure, there is provided a polishing cleaning mechanism configured to be in contact with a rear surface of a substrate which is held in a substrate holding unit for holding the rear surface of the substrate and perform a polishing process and a cleaning process on the rear surface of the substrate, which includes: a polishing member including a polishing surface configured to polish the rear surface of the substrate; a cleaning member including a cleaning surface configured to clean the rear surface of the substrate; a first support member configured to support the polishing member and the cleaning member; and a relative movement mechanism configured to move each of the polishing surface of the polishing member and, the cleaning surface of the cleaning member relative to the rear surface of the substrate held in the substrate holding unit by rotating the first support member.

According to still another aspect of the present disclosure, there is provided a substrate processing apparatus provided with the aforementioned polishing cleaning mechanism and configured to perform the polishing process and the cleaning process on the rear surface of the substrate held in the substrate holding unit for holding the rear surface of the substrate, which includes: a moving mechanism configured to relatively move the support member and the substrate held in the substrate holding unit; and a control unit configured to control the moving mechanism such that the relative height of the surface of the cleaning member facing the substrate and the surface of the polishing member facing the substrate is adjusted by relatively moving the support member and the substrate held in the substrate holding unit with the moving mechanism and pressing the cleaning member against the substrate to crush the cleaning member.

According to yet another aspect of the present disclosure, there is provided a substrate processing apparatus provided with the aforementioned polishing cleaning mechanism and configured to perform the polishing process and the cleaning process on the rear surface of the substrate held in the substrate holding unit for holding the rear surface of the substrate, which includes: a rotation drive mechanism configured to rotate the first support member about a vertical axis; a moving mechanism configured to relatively move the first support member and the substrate held in the substrate holding unit; and a control unit configured to execute a control operation such that while at least one of the cleaning member and the polishing member is pressed against the substrate by relatively moving the first support member and the substrate held in the substrate holding unit with the moving mechanism, the first support member is rotated by the rotation drive mechanism to move the polishing surface of the polishing member and the cleaning surface of the cleaning member relative to the rear surface of the substrate held in the substrate holding unit.

According to yet another aspect of the present disclosure, there is provided a substrate processing method for, using the aforementioned polishing cleaning mechanism, performing the polishing process and the cleaning process on the rear surface of the substrate held in the substrate holding unit for holding the rear surface of the substrate, which includes: performing the polishing process by bringing the polishing member into contact with the rear surface of the substrate while a height of a surface of the polishing member facing the substrate is made equal to or higher than a height of a surface of the cleaning member facing the substrate; and performing the cleaning process by bringing only the cleaning member into contact with the rear surface of the substrate while the height of the surface of the polishing member facing the substrate is made lower than the height of the surface of the cleaning member facing the substrate.

According to yet another aspect of the present disclosure, there is provided a substrate processing method for, using the aforementioned polishing cleaning mechanism, performing the polishing process and the cleaning process on the rear surface of the substrate held in the substrate holding unit for holding the rear surface of the substrate, which includes: performing one of the cleaning process and the polishing process by rotating the first support member in a specified direction while at least one of the polishing surface of the polishing member and the cleaning surface of the cleaning member is in contact with the rear surface of the substrate and by moving the polishing surface of the polishing member and the cleaning surface of the cleaning member relative to the rear surface of the substrate held in the substrate holding unit; and switching the polishing process and the cleaning process by rotating the first support member in a direction opposite to the specified direction.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
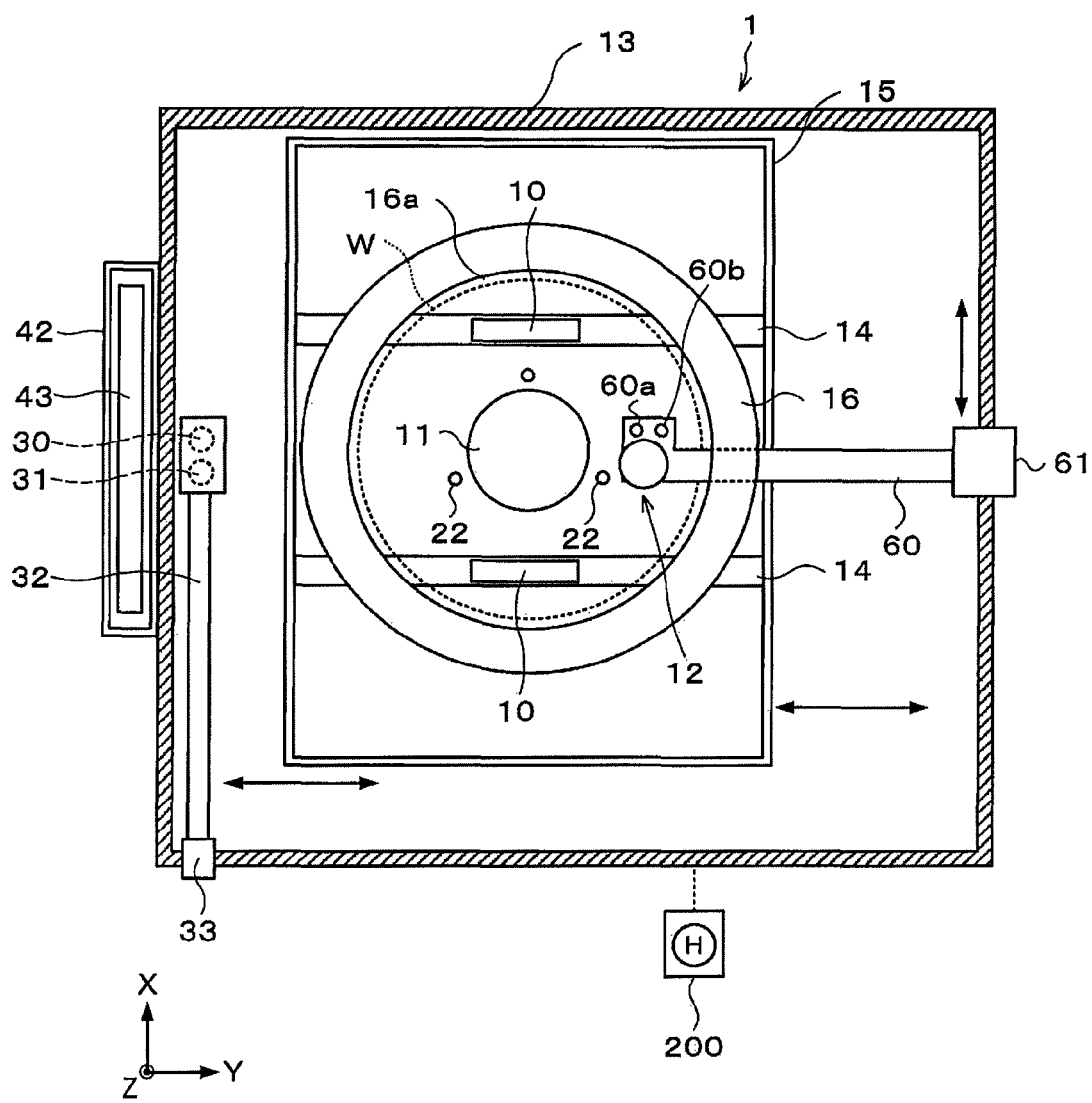
FIG. 1 schematically illustrates a configuration of a substrate processing apparatus in a horizontal sectional view, according to one embodiment of the present disclosure.
Figure 2:
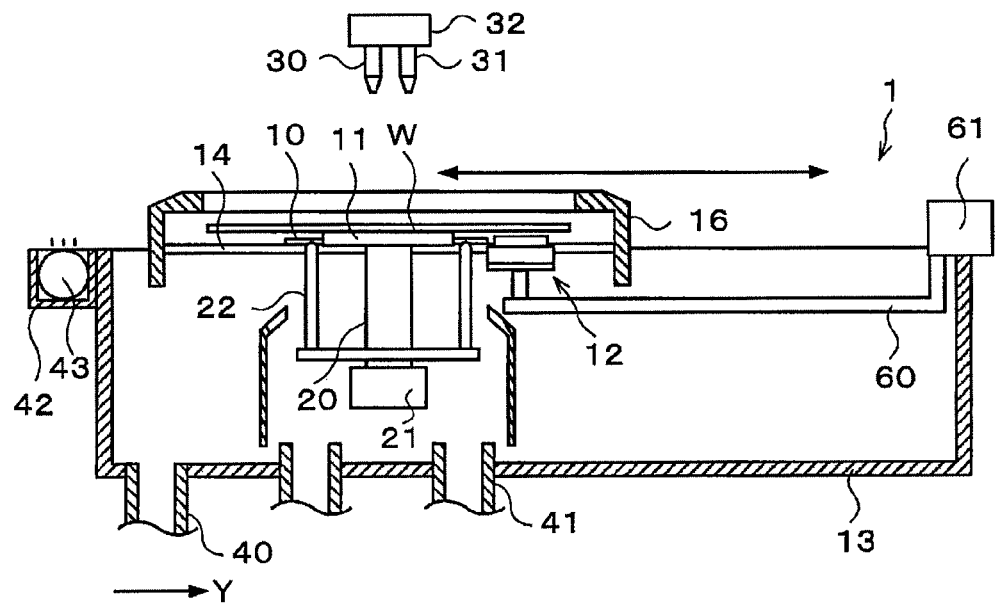
FIG. 2 schematically illustrates the configuration of the substrate processing apparatus in a vertical sectional view, according to one embodiment of the present embodiment.

FIG. 1 schematically illustrates a configuration of a substrate processing apparatus 1 in a horizontal sectional view. FIG. 2 schematically illustrates the configuration of the substrate processing apparatus 1 in a vertical sectional view.

The substrate processing apparatus 1 includes two attraction pads 10 configured to horizontally attract and hold a rear surface of a wafer W, a spin chuck 11 configured to horizontally attract and hold the rear surface of the wafer W received from the attraction pads 10, a polishing cleaning mechanism 12 configured to perform a polishing process and a cleaning process on the rear surface of the wafer W, and a housing 13 with an upper surface opened.

As shown in FIG. 1, the two attraction pads 10 are formed in an elongated substantially-rectangular shape and are installed to be parallel to each other with the spin chuck 11 interposed therebetween, in a top view, such that the attraction pads 10 can hold peripheral edge portions of the rear surface of the wafer W. The attraction pads 10 are supported by substantially rectangular support plates 14, respectively, which are longer than the attraction pads 10. A frame 15, which can be moved in a horizontal direction (i.e., a Y-axis direction in FIG. 1) and a vertical direction (i.e., a Z-axis direction perpendicular to the drawing sheet surface of FIG. 1) by a drive mechanism (not shown), is configured to support opposite ends of the support plates 14.

An upper cup 16 is installed on an upper surface of the frame 15. An opening portion 16a having a diameter larger than a diameter of the wafer W is formed on an upper surface of the upper cup 16. Through the opening portion 16a, the wafer W is conveyed between a transfer mechanism installed outside the substrate processing apparatus 1 and the attraction pads 10.

As shown in FIG. 2, the spin chuck 11 is connected to a drive mechanism 21 via a shaft 20 and can be rotated and vertically moved by the drive mechanism 21. For example, by adjusting a vertical position of the spin chuck 11, it is possible to regulate a pressure exerted when the polishing cleaning mechanism 12 makes contact with the wafer W.

For example, three lifter pins 22 which can be moved up and down by an elevator mechanism (not shown) are installed around the spin chuck 11. Thus, the wafer W can be conveyed between the lifter pins 22 and the transfer mechanism (not shown) installed outside the substrate processing apparatus 1.

In the substrate processing apparatus 1, a cleaning nozzle 30 configured to supply a cleaning liquid to a front surface of the wafer W held by the spin chuck 11 and a gas nozzle 31 configured to spray a drying gas to the front surface of the wafer W are installed above the wafer W. For example, pure water is used as the cleaning liquid. For example, a nitrogen gas or clean air is used as the drying gas. A common nozzle arm 32 supports the cleaning nozzle 30 and the gas nozzle 31. A drive mechanism 33 configured to move the nozzle arm 32 in the vertical direction (i.e., the Z-axis direction perpendicular to the drawing sheet surface in FIG. 1) is connected to the nozzle arm 32. The drive mechanism 33 is connected to the housing 13 and can be horizontally moved in the Y-axis direction along the housing 13.

In a bottom portion of the housing 13, there are installed a drain pipe 40 for draining the cleaning liquid and an exhaust pipe 41 for forming a downward airflow within the substrate processing apparatus 1 and exhausting the airflow.

As shown in FIGS. 1 and 2, an ultraviolet lamp 43 disposed within an accommodation box 42 having an open upper surface is installed, for example, in a sidewall of the housing 13 and, for example, in a route through which the transfer mechanism (not shown) installed outside the substrate processing apparatus 1 passes when moving onto the opening portion 16a of the upper cup 16. Thus, the ultraviolet lamp 43 can irradiate the rear surface of the wafer W with ultraviolet rays when the wafer W is transferred into and out of the substrate processing apparatus 1 by the transfer mechanism (not shown). For example, even if particles originating from a polymer remain on the rear surface of the cleaned wafer W, the particles are shrunken and removed by the ultraviolet rays.

Figure 3:
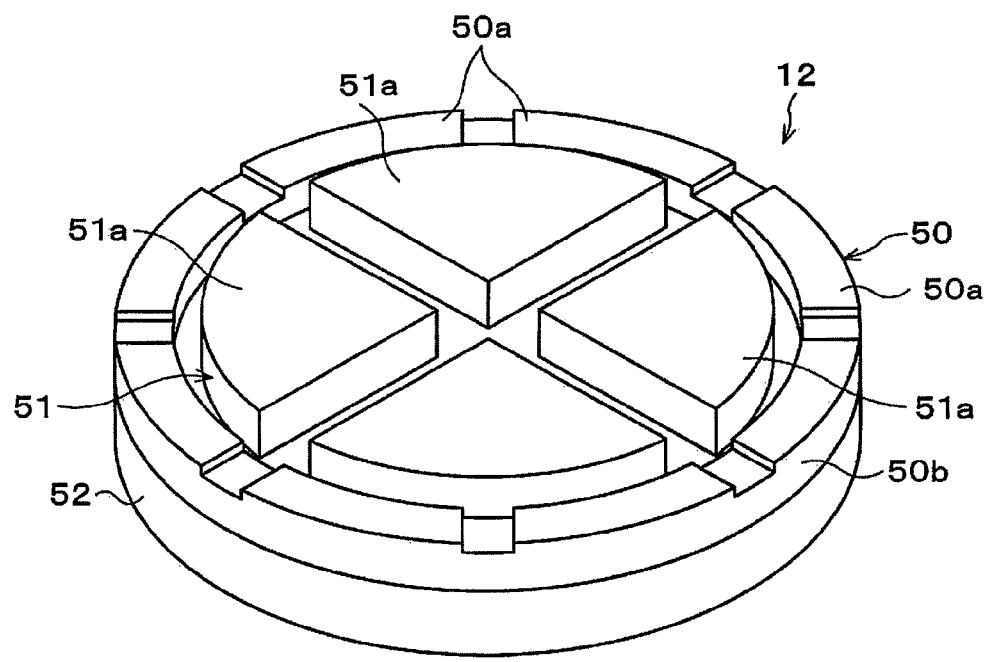
FIG. 3 schematically illustrates a configuration of a polishing cleaning mechanism in a perspective view.
Figure 4:
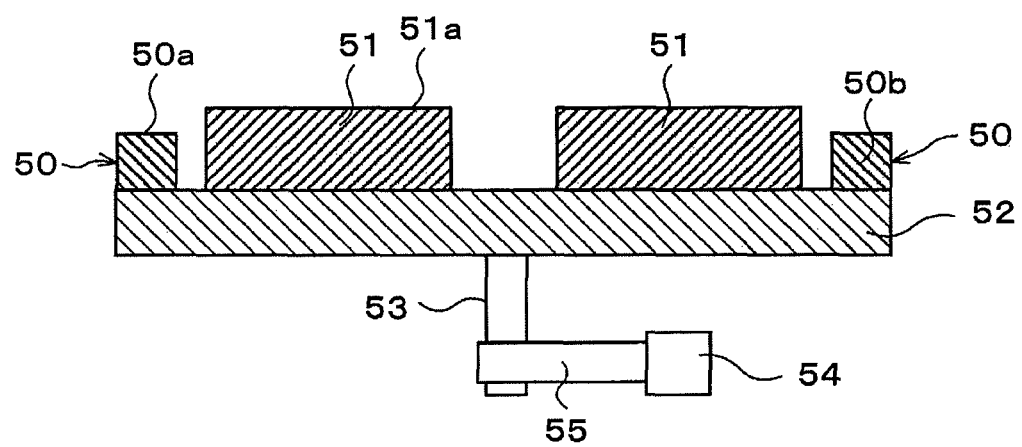
FIG. 4 schematically illustrates the configuration of the polishing cleaning mechanism is in a vertical sectional view.

Next, description will be made on the polishing cleaning mechanism 12 that performs a polishing process and a cleaning process for the rear surface of the wafer W. For example, as shown in FIGS. 3 and 4, the polishing cleaning mechanism 12 includes a polishing member 50 having polishing surfaces 50a made of, for example, foamed urethane, non-woven fabric, or the like, a plurality of cleaning members 51 made of an flexible material, for example, polyvinyl alcohol, polypropylene, nylon, or the like, and a support member 52 configured to support the polishing member 50 and the cleaning members 51. Each of the polishing surfaces 50a of the polishing member 50 is configured, for example, by bonding a sheet formed of foamed urethane or non-woven fabric to an upper surface of a substantially ring-shaped member 50b, which has a diameter smaller than a diameter of the wafer W, for example, equal to about one fourth of the diameter of the wafer W. As an example of the shape of the polishing member 50, FIG.

3 illustrates that eight arc-shaped polishing surfaces 50a having a specified width are concentrically arranged at a predetermined interval.

The cleaning members 51 are formed for example, in a fan shape, and are disposed inside the annular polishing member 50 to be concentric with the polishing member 50. FIG. 3 illustrates an example where four fan-shaped cleaning members 51 are disposed inside the polishing member 50.

Figure 5:
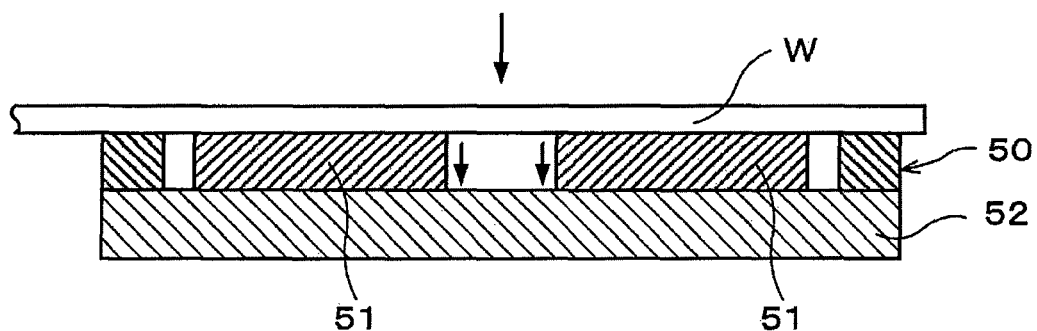
FIG. 5 illustrates that the polishing cleaning mechanism is pressed against a wafer.

Surfaces of the polishing member 50 and the cleaning members 51, which are opposite to the support member 52, include, respectively, the polishing surfaces 50a and cleaning surfaces 51a installed to face the wafer W. For example, as shown in FIG. 4, the cleaning surfaces 51a of the cleaning members 51 may be formed to protrude upward beyond the polishing surfaces 50a of the polishing member 50. Therefore, when the polishing cleaning mechanism 12 is vertically moved, for example, by using a moving mechanism 61, which will be described below, such that a distance between the polishing cleaning mechanism 12 and the rear surface of the wafer W is shortened gradually, the cleaning members 51 initially make contact with the rear surface of the wafer W. The cleaning members 51 are made of a flexible material. Thus, when the polishing cleaning mechanism 12 is pressed further against the wafer W by the moving mechanism 61 after the cleaning members 51 make contact with the wafer W, the cleaning members 51 are crushed as shown in FIG. 5 and the polishing member 50 comes into contact with the rear surface of the wafer W and can polish the wafer W.

A shaft 53 is installed on a surface of the support member 52, which is opposite to the other surface supporting the polishing member 50 and the cleaning members 51. A belt 55 connected to a motor 54 is installed in a lower end portion of the shaft 53. Driving the belt 55 with the motor 54 can rotate, via the shaft 53, the support member 52, and ultimately, the polishing surfaces 50a of the polishing member 50 and the cleaning surfaces 51a of the cleaning members 51. Thus, a polishing process and a cleaning process can be performed on the rear surface of the wafer W by rotating the support member 52 in a state in which the polishing surfaces 50a of the polishing member 50 and the cleaning surfaces 51a of the cleaning members 51 are in contact with the rear surface of the wafer W.

The moving mechanism 61 is connected to the polishing cleaning mechanism 12 via a support body 60. The moving mechanism 61 is connected to the housing 13 and can be horizontally moved, for example, in the X-axis direction in FIG. 1, along the housing 13. Moving the moving mechanism 61 in the X-axis direction can move the polishing cleaning mechanism 12 in the X-axis direction in FIG. 1.

Installed at an end portion of the support body 60 are a cleaning liquid nozzle 60a, which supplies a cleaning liquid for washing away the particles removed by the cleaning members 51 and the polishing sludge generated when the polishing process is performed by the polishing member 50, and a purge nozzle 60b, which supplies a gas, for example, a nitrogen gas, for drying the cleaning liquid adhering to the rear surface of the cleaned wafer W. Pure water in which a carbon dioxide gas is dissolved may be used as the cleaning liquid supplied from the cleaning liquid nozzle 60a.

As shown in FIG. 1, a control unit 200 is installed in the substrate processing apparatus 1 described above. The control unit 200 is, for example, a computer, and is provided with a program storage, unit (not shown). A program for controlling the processing of the wafer W performed in the substrate processing apparatus 1 is stored in the program storage unit. Also stored in the program storage unit is a program for implementing the polishing process and the cleaning process in the substrate processing apparatus 1 by controlling the operation of a drive system such as various kinds of drive devices and moving devices described above and various kinds of nozzles. The aforementioned programs may be recorded in a computer-readable storage medium H such as a hard disk (HD), a flexible disk (FD), a compact disk (CD), a magneto-optical disk (MO), a memory card, and the like, and may be installed in the control unit 200 from the storage medium H.

The substrate processing apparatus 1 according to the present embodiment is configured as described above. Next, description will be made on the polishing process and the cleaning process of the wafer W which are performed in the substrate processing apparatus 1. In this embodiment, description will be made on an example where the wafer W is first subjected to the polishing process and then to the cleaning process.

Figure 6:
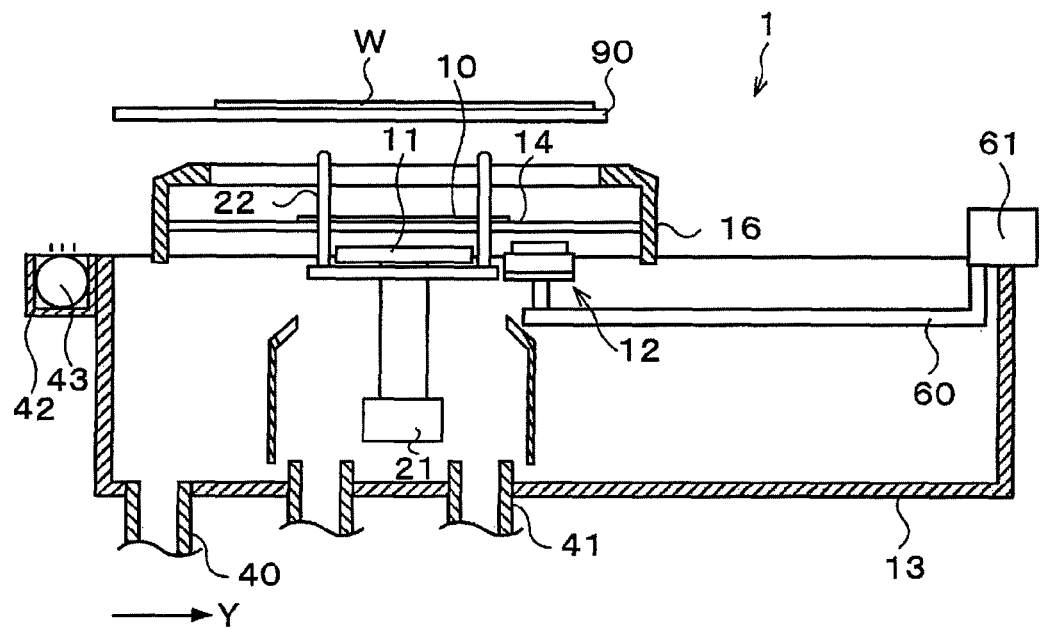
FIG. 6 illustrates delivery of the wafer to the substrate processing apparatus.
Figure 7:
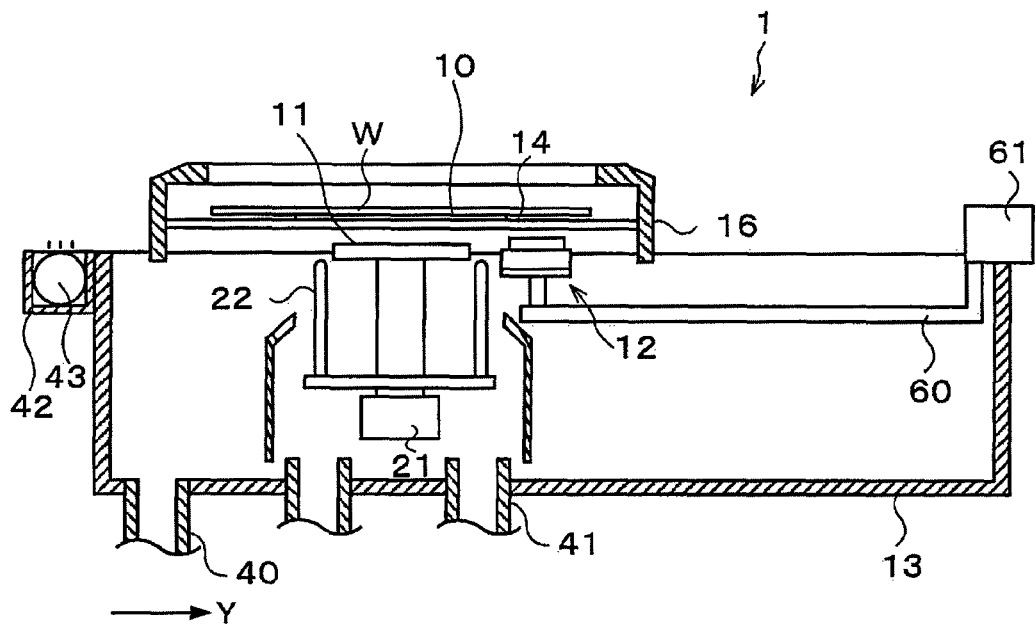
FIG. 7 illustrates that the wafer has been delivered to the substrate processing apparatus.

When the wafer W is processed, the wafer W is transferred above the upper cup 16 by a transfer mechanism 90 installed outside the substrate processing apparatus 1, as shown in FIG. 6. The lifter pins 22 are then moved upward and the wafer W is delivered to the lifter pins 22. In this case, the attraction pads 10 wait at a position where the upper surfaces of the attraction pads 10 are higher than the upper surface of the polishing cleaning mechanism 12. The spin chuck 11 retreats to a position lower than the upper surface of the polishing cleaning mechanism 12. Thereafter, the lifter pins 22 move downward. As shown in FIG. 7, the wafer W is delivered to the attraction pads 10, which in turn attract and hold the wafer W.

Figure 8:
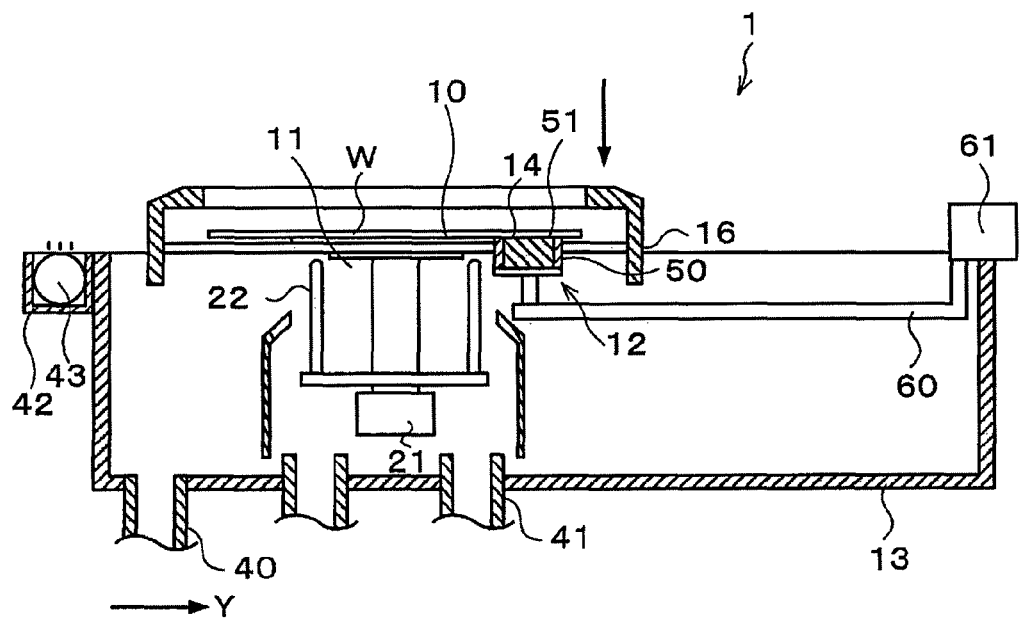
FIG. 8 illustrates that the polishing cleaning mechanism is brought into contact with the wafer.

Next, as shown in FIG. 8, the attraction pads 10 move downward to bring the polishing cleaning mechanism 12 into contact with an outer peripheral portion of the rear surface of the wafer W. In this case, the cleaning members 51 of the polishing cleaning mechanism 12 initially make contact with the rear surface of the wafer W. When the attraction pads 10 continue to move downward after the wafer W and the cleaning members 51 make contact with each other, the cleaning members 51 are crushed. Thus, as shown in FIG. 5, the polishing member 50 comes into contact with the outer peripheral portion of the rear surface of the wafer W. In one embodiment, instead of moving the attraction pads 10 downward, the polishing cleaning mechanism 12 may be moved upward by the moving mechanism 61 such that the polishing cleaning mechanism 12 is pressed against the wafer W. Also, it may be possible to move both the attraction pads 10 and the moving mechanism 61. A load for pressing the polishing cleaning mechanism 12 may be determined by a test conducted in advance. For example, a load measuring instrument for measuring the load may be installed between the support member 52 and the cleaning members 51. The load may be adjusted based on the measurement result of the load measuring instrument.

Figure 9:
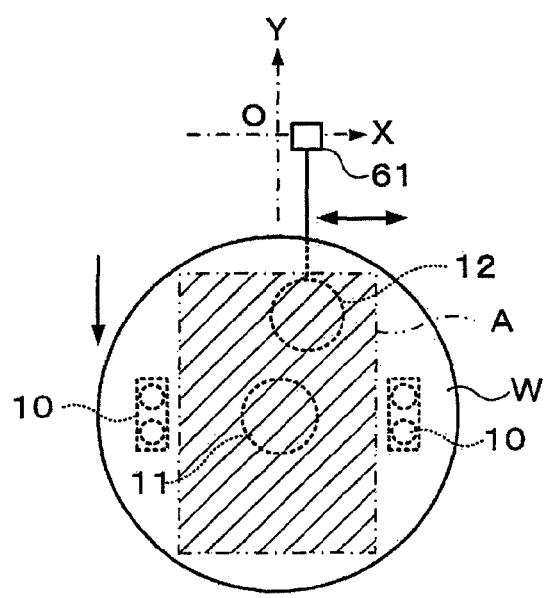
FIG. 9 schematically illustrates a relative positional relationship between the wafer and the polishing cleaning mechanism during a polishing process and a cleaning process.

Next, the cleaning liquid is supplied from the cleaning liquid nozzle 60a and the support member 52 of the polishing cleaning mechanism 12 is rotated. Subsequently, for example, as shown in FIG. 9, the polishing cleaning mechanism 12 reciprocates in the X-axis direction while the attraction pads 10 and the wafer W are moved toward the negative side of the Y-axis direction. As such, a region A in the rear surface of the wafer W between the attraction pads 10 is polished. In this process, the cleaning liquid is also supplied from the cleaning nozzle 30 to clean the front surface of the wafer W concurrently. The origin O shown in FIG. 9 indicates a position when the moving mechanism 61 is moved toward a center of the wafer W over the frame 15.

Figure 11:
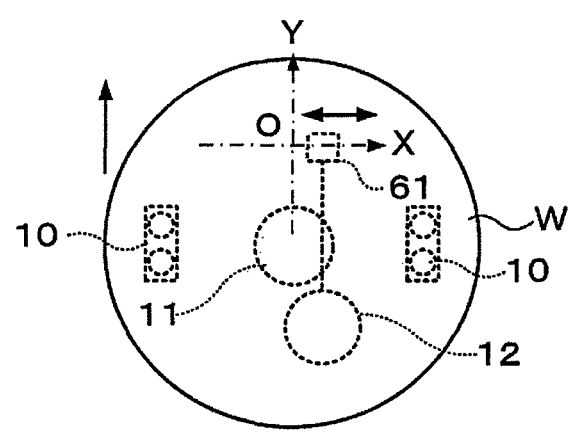
FIG. 11 schematically illustrates a relative positional relationship between the wafer and the polishing cleaning mechanism during the polishing process and the cleaning process.

In FIGS. 9 and 11, the origins O are illustrated to show a relative positional relationship between the polishing cleaning mechanism 12 and the wafer W.

Figure 10:
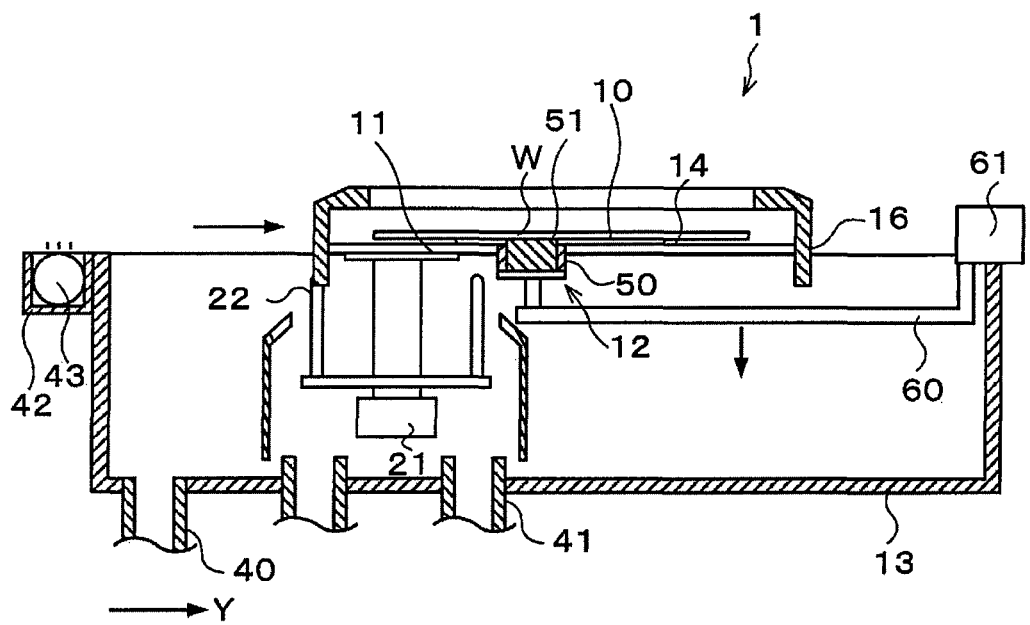
FIG. 10 illustrates that only a cleaning member is brought into contact with the wafer.

Next, as shown in FIG. 10, the polishing cleaning mechanism 12 is slightly moved away from the rear surface of the wafer W so that only the cleaning members 51 make contact with the rear surface of the wafer W. In this case, only the attraction pads 10 may be moved up and down, only the moving mechanism 61 may be moved up and down, or both the attraction pads 10 and the moving mechanism 61 may be moved up and down. Subsequently, as shown in FIG. 11, while the polishing cleaning mechanism 12 reciprocates in the X-axis direction, the wafer W is moved toward the positive side of the Y-axis direction to clean the rear surface of the wafer W. Thus, the region A in the rear surface of the wafer W between the attraction pads 10, which is illustrated in FIG. 9, is cleaned. Accordingly, the region A can be polished and cleaned while the wafer W reciprocates along the Y-axis direction.

Next, a central portion of the rear surface of the wafer W is cleaned by supplying the cleaning liquid from the cleaning liquid nozzle 60a and rotating the support member 52. In this case, the support body 60 reciprocates in the X-axis direction in FIG. 1 and the frame 15 reciprocates in the Y-axis direction. Thus, the central portion of the rear surface of the wafer W may be evenly cleaned. In this process, electric charges of the wafer W that are charged by electrostatic induction may be removed by using pure water in which a carbon dioxide gas is dissolved as the cleaning liquid supplied from the cleaning liquid nozzle 60a. As a result, the particles having adhered to the rear surface of the wafer W, for example, by a Coulomb's force may be easily washed away. In addition, although the particles themselves are electrically charged, charges of the particles can be removed, and thus, the rear surface of the wafer W may be efficiently cleaned. In this case, the cleaning liquid nozzle 60a serves as an electric charge removal mechanism for removing electric charges of the wafer W. The method of removing electric charges of the wafer W is not limited to the present embodiment. As an alternative example, the purge nozzle 60b may be used as an ionizer for supplying ionized air.

Figure 12:
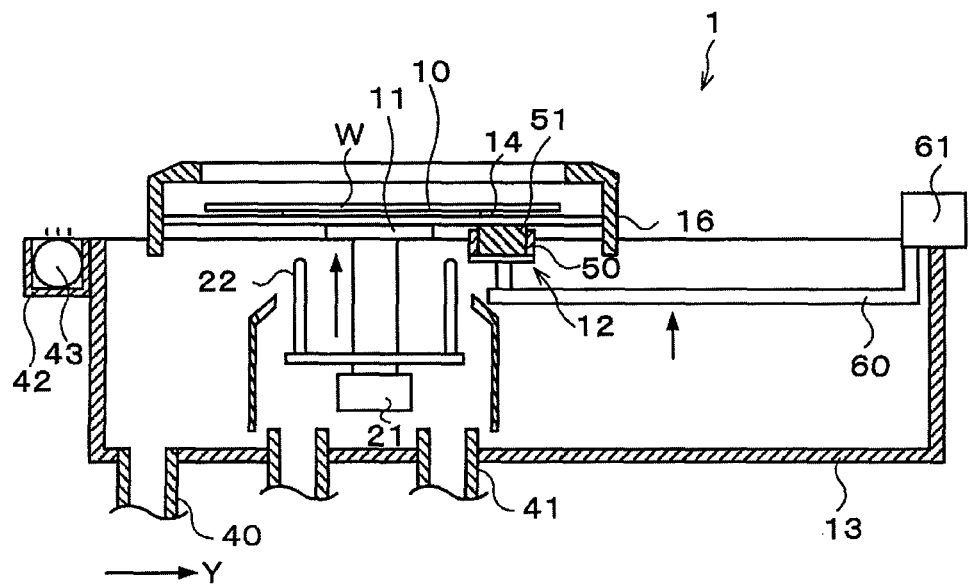
FIG. 12 illustrates that the wafer has been delivered to a spin chuck.
Figure 13:
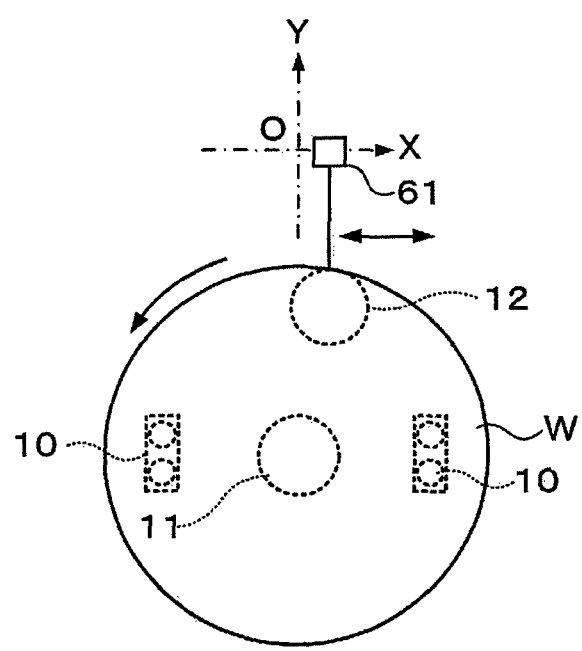
FIG. 13 schematically illustrates a relative positional relationship between the wafer and the polishing cleaning mechanism during the polishing process and the cleaning process.

Upon finishing the polishing process and the cleaning process on the region A in the rear surface of the wafer W, the frame 15 moves horizontally, as illustrated in FIG. 12, such that the center of the wafer W and the center of the spin chuck 11 coincide with each other when seen in a top view. Subsequently, the spin chuck 11 is moved upward and the wafer W is delivered from the attraction pads 10 to the spin chuck 11. As shown in FIG. 13, the wafer W is then moved toward the negative side of the Y-axis direction so that the polishing cleaning mechanism 12 can make contact with the outer peripheral portion of the wafer W. Then, the distance between the wafer W and the polishing cleaning mechanism 12 is shortened to bring the polishing member 50 and the cleaning members 51 into contact with the wafer W.

Subsequently, the wafer W is rotated by the spin chuck 11 in such a state that the polishing member 50 and the cleaning members 51 are pressed against the rear surface of the wafer W. The polishing cleaning mechanism 12 is slidingly moved in the X-axis direction by the moving mechanism 61. As such, the outer peripheral portion of the rear surface of the wafer W is polished. Thereafter, the polishing cleaning mechanism 12 is slightly moved away from the rear surface of the wafer W such that only the cleaning members 51 make contact with the rear surface of the wafer W. The wafer W is then rotated to clean the outer peripheral portion of the rear surface of the wafer W.

Upon finishing the cleaning process of the rear surface of the wafer W, the rotation of the polishing cleaning mechanism 12 and the supply of the cleaning liquid are stopped. The spin chuck 11 is rotated at a high speed to thereby centrifugally remove and dry the cleaning liquid adhering to the rear surface of the wafer W. In this process, the purge using the gas nozzle 31 and the purge nozzle 60b is performed concurrently.

If the drying process of the wafer W is finished, the wafer W is delivered to the transfer mechanism 90 in an order opposite to the order in which the wafer W is transferred into the substrate processing apparatus 1. As such, the polishing process and the cleaning process on the wafer W are finished.

According to the above described embodiment, the cleaning members 51 are made of a flexible material. By pressing the polishing cleaning mechanism 12 against the wafer W, it is possible to adjust a relative height of the polishing surfaces 50a of the polishing member 50 and the cleaning surfaces 51a of the cleaning members 51 supported on the support member 52. Accordingly, the polishing process can be performed by bringing the polishing member 50 into contact with the wafer W. Subsequently, only the cleaning members 51 can keep contact with the rear surface of the wafer W by adjusting the position of the polishing cleaning mechanism 12 such that the cleaning members 51 are positioned higher than the polishing member 50. In this manner, the polishing process and the cleaning process can be performed within the substrate processing apparatus 1.

Since the polishing member 50 and the cleaning members 51 are installed in one support body 60, it is possible to minimize the moving mechanism 61 for moving the support body 60, which may reduce a size of the substrate processing apparatus 1. Furthermore, there is no need to install the support body 60 individually for polishing member 50 and the cleaning members 51. Therefore, the control for moving the polishing member 50 and the cleaning members 51 may not be complicated.

Figure 14:
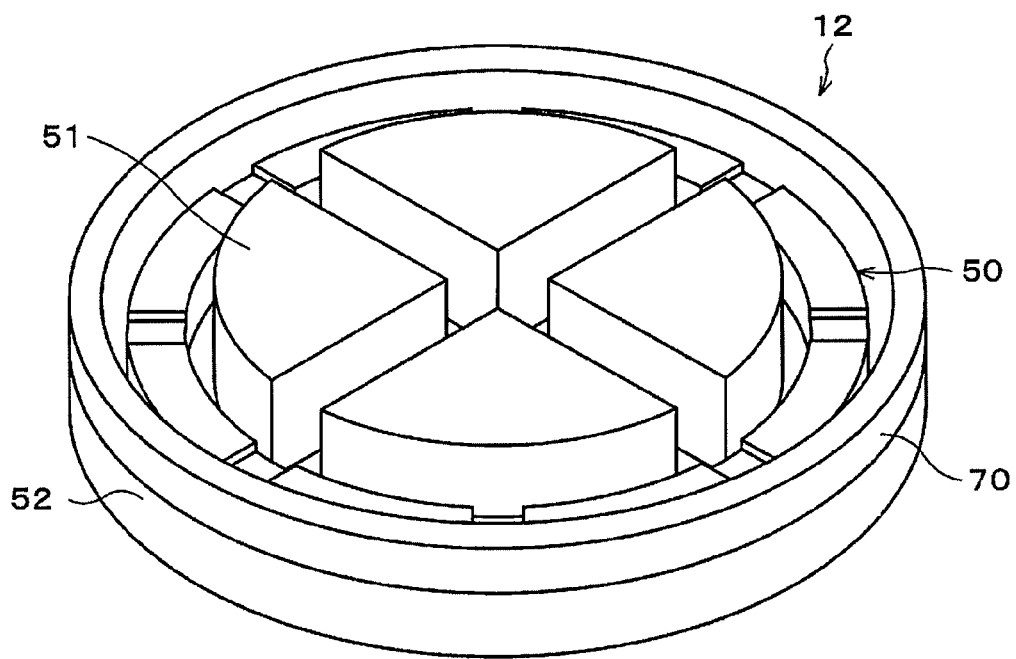
FIG. 14 schematically illustrates a configuration of a polishing cleaning mechanism in a perspective view, according to another embodiment of the present disclosure.
Figure 15:
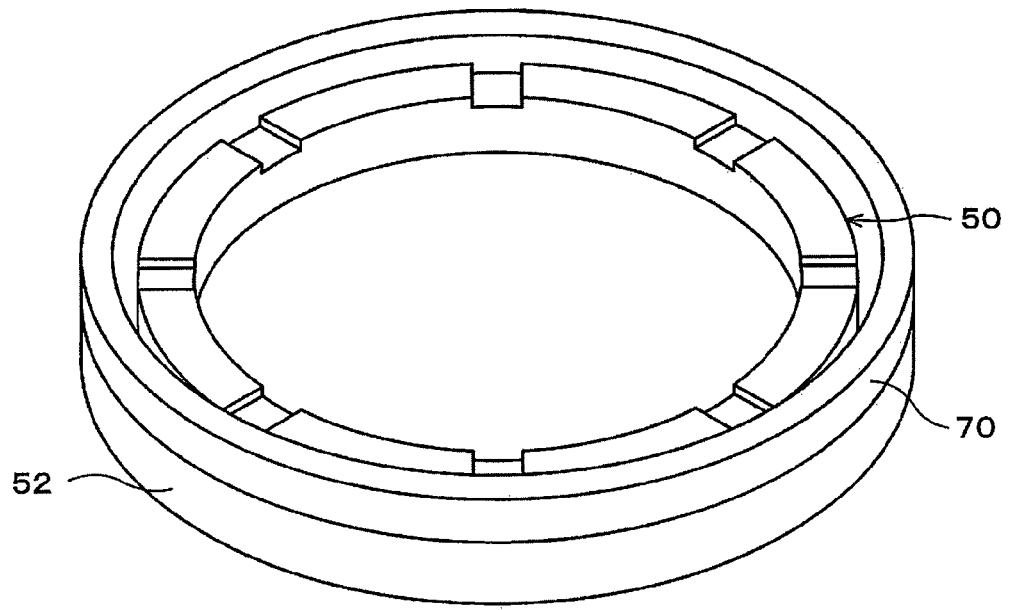
FIG. 15 schematically illustrates a configuration of a polishing cleaning mechanism in a perspective view, according to another embodiment of the present disclosure.
Figure 16:
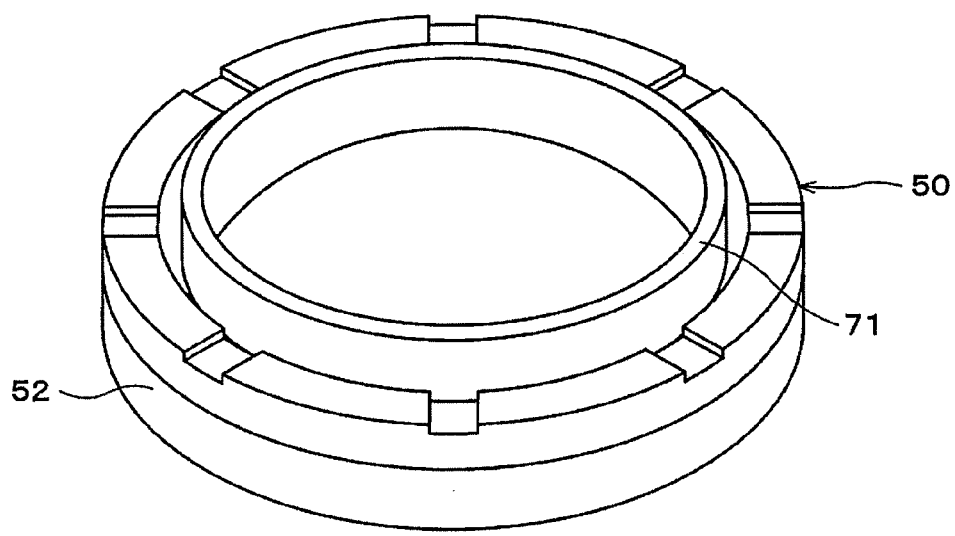
FIG. 16 schematically illustrates a configuration of a polishing cleaning mechanism in a perspective view, according to another embodiment of the present disclosure.

In the above described embodiment, the cleaning members 51 are disposed inside the substantially ring-shaped polishing member 50. However, the shape and arrangement of the polishing member 50 and the cleaning members 51 are not limited to the above embodiment. For example, as illustrated in FIG. 14, the diameter of the support member 52 may be increased and an additional cleaning member 70 may be installed outside the polishing member 50. Moreover, as depicted in FIG. 15, an annular cleaning member 70 may be installed only outside the polishing member 50. As shown in FIG. 16, an annular cleaning member 71 may be installed only inside the polishing member 50. Further, the polishing member 50 and the cleaning members 51, 70, and 71 need not be necessarily installed concentrically.

Figure 17:
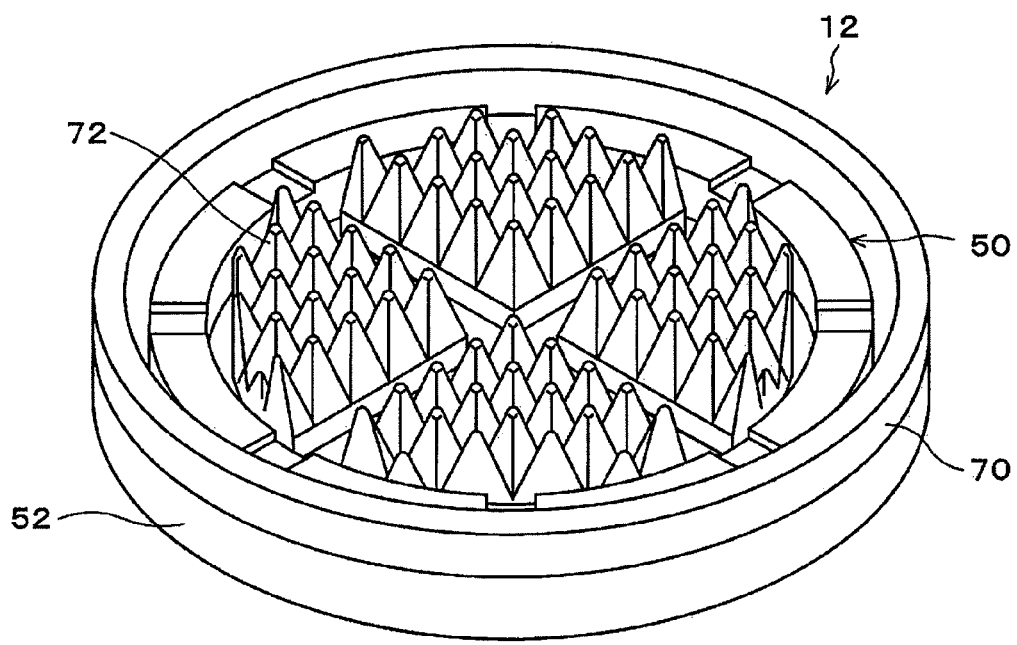
FIG. 17 schematically illustrates a configuration of a polishing cleaning mechanism in a perspective view, according to another embodiment of the present disclosure.

In addition, the cleaning surfaces of the cleaning members 51, 70, and 71 need not be necessarily flat. For example, as illustrated with a cleaning member 72 in FIG. 17, the cleaning surfaces of the cleaning members 51, 70, and 71 may be formed in an uneven shape of a specified pattern as long as the cleaning members 51, 70, and 71 can be crushed by pressing the polishing cleaning mechanism 12 against the wafer W. In such a case, the cleaning surface of the cleaning member 70 or the cleaning member 72 is installed to protrude upward beyond the polishing surfaces of the polishing member 50. The inventors of the present disclosure found that as the pressing load increases when the polishing cleaning mechanism 12 is pressed against the wafer W to crush the cleaning member, the wafer W is bent to hinder maintaining a proper contact between the cleaning member and the wafer W. As such, if an area of the cleaning surfaces of the cleaning members is increased to enhance efficiency of cleaning, a load for crushing the cleaning member is also increased in proportion thereto, which may result in reducing the efficiency of cleaning. Therefore, a surface area of the cleaning surface of the cleaning member may need to be properly set in view of the load for pressing the polishing cleaning mechanism 12 against the wafer W. The shape of the cleaning member may be, for example, an annular shape as illustrated with the cleaning members 70 and 71 in FIGS. 15 and 16, or an uneven shape as illustrated with the cleaning member 72 in FIG. 17. Further, the shape of the cleaning member may be configured to reduce the crushing load as the contact area between the cleaning surface and the wafer W is reduced.

Particularly, since the polishing cleaning mechanism 12 is moved relative to the wafer W in the polishing process and the cleaning process of the wafer W, if the shape of the cleaning member is an annular shape as illustrated with the cleaning members 70 and 71, the extent for cleaning may reach to the outer diameter of the cleaning member 70 or 71. In addition, if the width, i.e., the difference between the inner diameter and the outer diameter, of the cleaning member 70 or 71 is decreased, it is possible to reduce the area of the cleaning surface which governs the area making contact with the wafer W, while maintaining the extent for cleaning. Accordingly, the shape of the cleaning members may have an annular cleaning surface as illustrated with the cleaning members 70 and 71.

Figure 18:
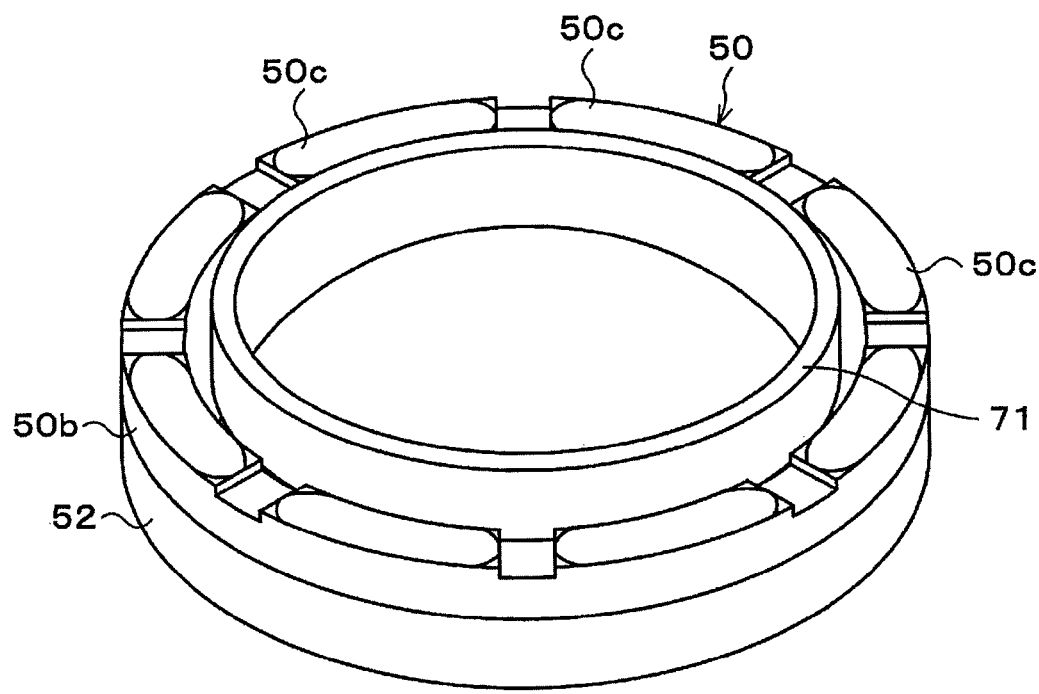
FIG. 18 schematically illustrates a configuration of a polishing cleaning mechanism in a perspective view, according to another embodiment of the present disclosure.
Figure 19:
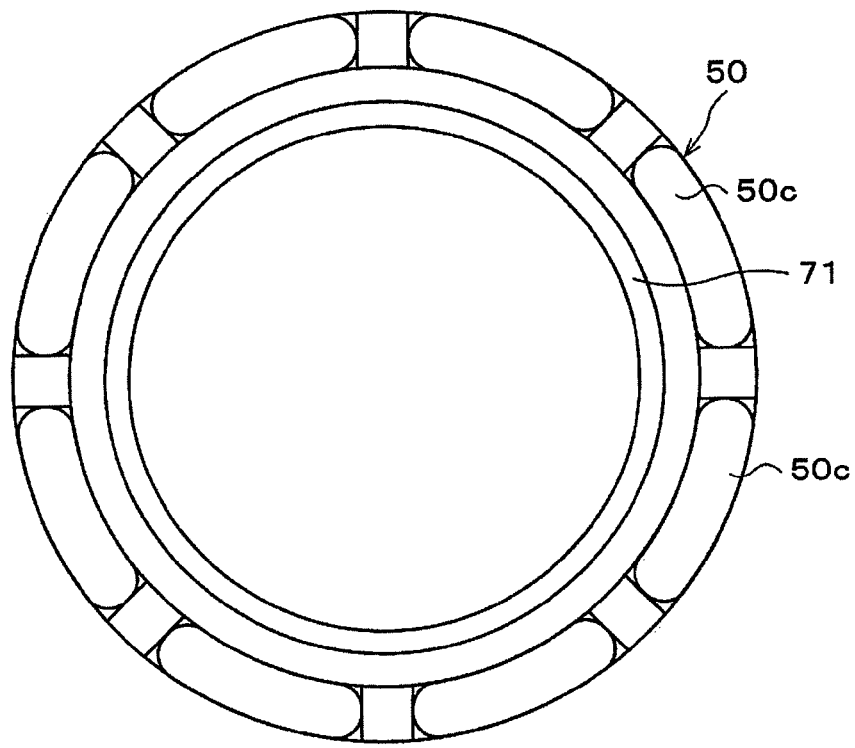
FIG. 19 schematically illustrates the configuration of the polishing cleaning mechanism in a plane view, according to the embodiment of the present disclosure.

In the above described embodiment, the polishing surfaces 50a of the polishing member 50 are formed, for example, in a circular arc shape having a specified width. The shape of the polishing surfaces 50a may have no corner in their outer circumference in a tov view. FIGS. 18 and 19 illustrate an example of a perspective view and a plane view of the polishing cleaning mechanism 12 that has polishing surfaces 50c in an exemplary shape. The inventors of the present disclosure discovered that if corners exist in outer circumferences of the polishing surfaces 50a, the corners of the polishing surfaces 50a may make contact with the wafer W and may scratch the wafer W. Thus, if the polishing surfaces 50c each having an outer circumference shape defined by a curve with no corner as shown in FIGS. 18 and 19 are formed, for example, by round-chamfering the corners of the polishing surfaces 50a shown in FIG. 3, the generation of scratches on the wafer W can be suppressed when the polishing surfaces 50c are in contact with the wafer W.

When the load for pressing the polishing cleaning mechanism 12 against the wafer W is constant, the surface pressure that is applied when the polishing surfaces make contact with the wafer W increases as the contact area between the polishing surfaces and the wafer W decreases. In this case, the polishing power is increased. Therefore, the arc-shaped polishing surfaces 50c which are divided into eight sections in FIG. 19 may be divided into, for example, sixteen sections or thirty two sections, to reduce the total sum of the surface areas of the polishing surfaces 50c.

Figure 20:
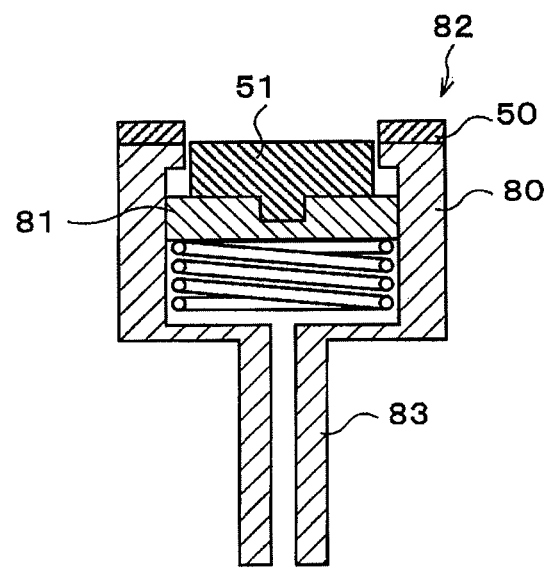
FIG. 20 schematically illustrates a configuration of a polishing cleaning mechanism in a vertical sectional view, according to another embodiment of the present disclosure.

In the above described embodiment, the descriptions have been made by taking, as an example, a case where the polishing member 50 is brought into contact with the wafer W by pressing the polishing cleaning mechanism 12 against the wafer W. However, the method of changing the relative height of the polishing surfaces 50a of the polishing member 50 and the cleaning surfaces 51a of the cleaning members 51 is not limited to the present embodiment. For example, as illustrated in FIG. 20, a polishing cleaning mechanism 82 may be configured to be equipped with an elevator mechanism 81 between a support member 80 and the cleaning member 51 such that the cleaning member 51 is moved up and down by the elevator mechanism 81. FIG. 20 illustrates an example where the support member 80 is formed in a cylindrical shape with an upper opening, and the elevator mechanism 81 formed of, for example, a spring and a support plate, is installed to close the opening of the support member 80. Further, FIG. 20 illustrate a state in which the cleaning member 51 is positioned lower than the polishing member 50 and the polishing process is performed by the polishing cleaning mechanism 82.

Figure 21:
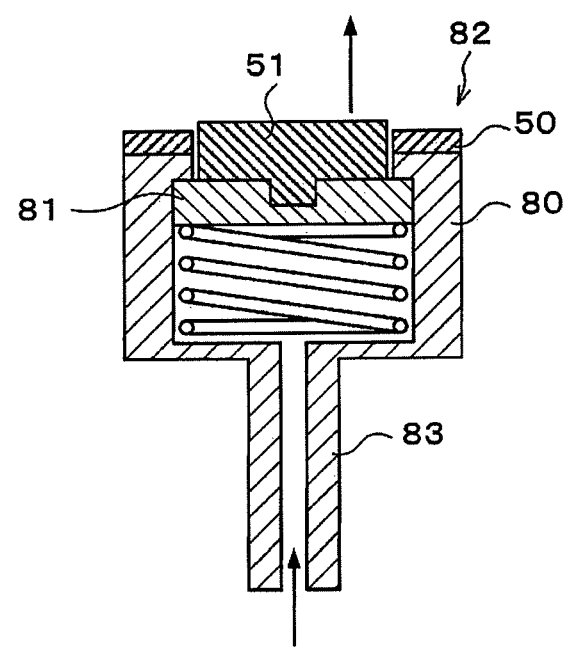
FIG. 21 schematically illustrates the configuration of the polishing cleaning mechanism in a vertical sectional view, according to the embodiment of the present disclosure.

As illustrated in FIG. 21, for example, when compressed air is supplied into a space surrounded by the support member 80 and the elevator mechanism 81 so that the elevator mechanism 81 is moved upward, the cleaning member 51 protrudes upward beyond the polishing surface 50a of the polishing member 50. As such, the polishing cleaning mechanism 82 comes into a state in which the polishing cleaning mechanism 82 can perform the cleaning process. In this case, the polishing process and the cleaning process may be performed efficiently within the substrate processing apparatus 1, like the case where the cleaning member 51 is crushed.

In FIGS. 20 and 21, the elevator mechanism 81 is moved upward by supplying compressed air. Alternatively, the spring constituting the elevator mechanism 81 may be configured to push up the cleaning member 51 to protrude upward beyond the polishing surface 50a of the polishing member 50 in a normal state. The spring may be compressed by evacuating the inside of the space surrounded by the support member 80 and the elevator mechanism 81. Alternatively, by disposing the polishing member 50 above the elevator mechanism 81 and the cleaning member 51 on the upper surface of the support member 80, the polishing member 50 may be moved up and down.

As another method of changing the relative height of the polishing surfaces 50a of the polishing member 50 and the cleaning surfaces 51a of the cleaning members 51, for example, a cam mechanism for converting rotating movement to reciprocating movement may be installed in the support member 52 that supports the polishing member 50 and the cleaning members 51. In this case, the contact state of the polishing member 50 and the cleaning members 51 with the wafer W may be changed by rotating the polishing cleaning mechanism.

Figure 22:
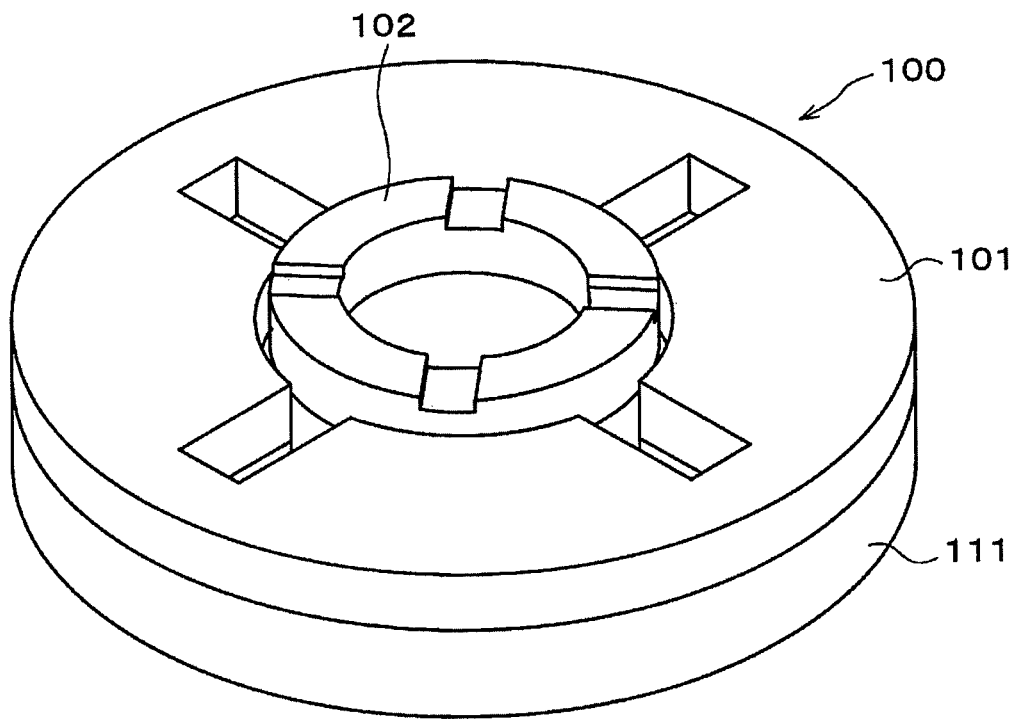
FIG. 22 schematically illustrates a configuration of a polishing cleaning mechanism in a perspective view, according to another embodiment of the present disclosure.
Figure 23:
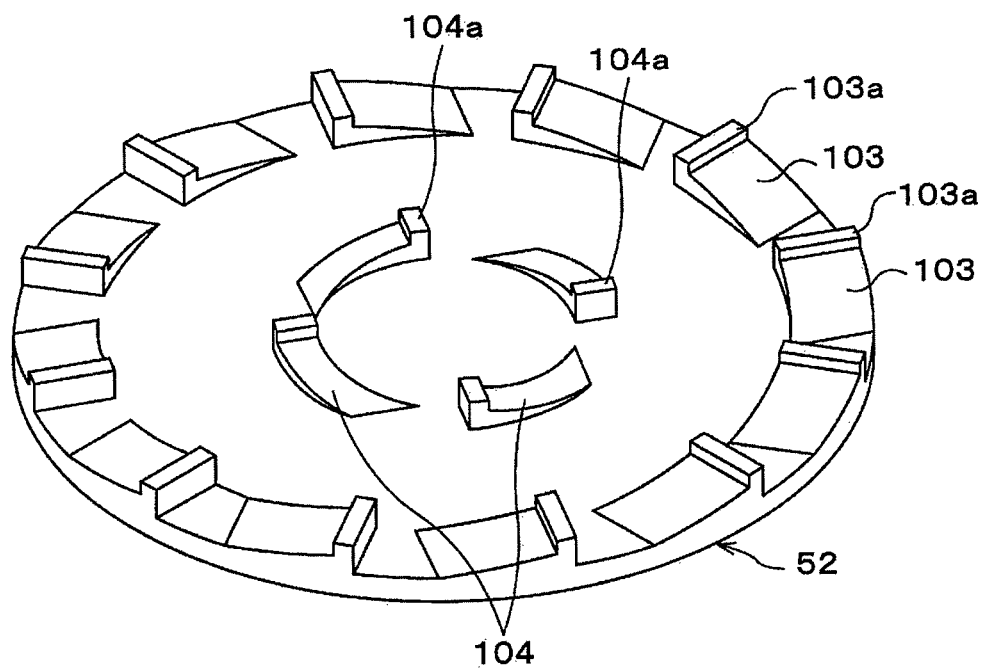
FIG. 23 schematically illustrates a configuration of a support member in a perspective view, according to the embodiment of the present disclosure.

FIG. 22 illustrates an example of a polishing cleaning mechanism 100, which is provided with a cam mechanism, according to another embodiment. The polishing cleaning mechanism 100 includes a cleaning member 101 having an opening formed in a central portion of the cleaning member 101 and a polishing member 102 installed within the opening of the cleaning member 101. As illustrated in FIG. 23, in the polishing cleaning mechanism 100, for example, first lower slant members 103 and second lower slant members 104, each of which has a slope extending along a circumferential direction of the support member 52 at a predetermined angle, are concentrically formed at a predetermined pitch in an outer peripheral portion and a central portion of an upper surface of the support member 52. The first lower slant members 103 and the second lower slant members 104 have slopes extending in opposite directions to each other. FIG. 23 illustrates an example where the first lower slant members 103 and the second lower slant members 104 are installed such that, for example, when the support member 52 is rotated clockwise, vertical positions of upper surfaces of the first lower slant members 103 installed in the outer peripheral portion is configured to get gradually higher and the vertical positions of upper surfaces of the second lower slant members 104 installed in the central portion is configured to get gradually lower. For example, a locking portion 103a is formed on a top portion at the slope of each of the first lower slant members 103 to extend vertically upward by a predetermined height, and a locking portion 104a is formed on a top portion at the slope of each of the second lower slant portions 104 to extend vertically upward by a predetermined height.

Figure 24:
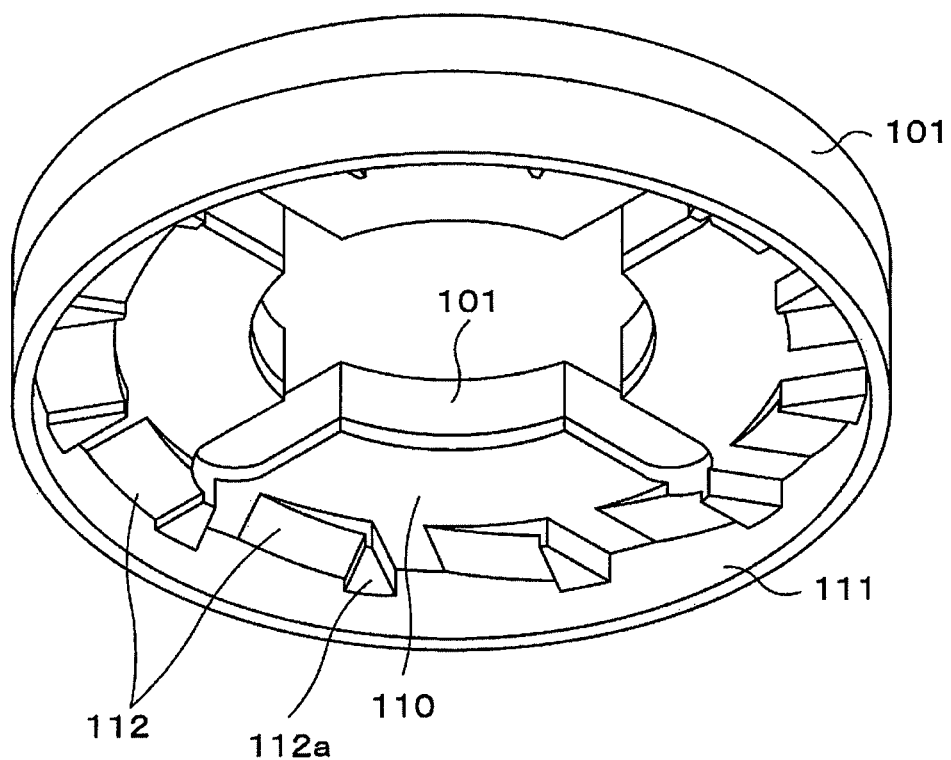
FIG. 24 schematically illustrates a configuration of a cleaning member in a perspective view, according to the embodiment of the present disclosure.

As illustrated in FIG. 24, for example, a lower surface of the cleaning member 101 is supported by a first rotating member 110 of a substantial disc shape which is substantially identical to the shape of the cleaning member 101 in a top view. A diameter of the first rotating member 110 is substantially equal to that of the support member 52. A cylindrical partition plate 111 extending vertically downward is installed on an outer side surface of the first rotating member 110. An inner diameter of the partition plate 111 is slightly larger than the diameter of the support member 52 such that the support member 52 can be accommodated in the partition plate 111.

A plurality of first upper slant members 112, each of which has a slope extending in a circumferential direction of the first rotating member 110 at a predetermined angle, is formed in an outer peripheral portion of a rear surface of the first rotating member 110, i.e., a surface of the first rotating member 110 opposite to the cleaning member 101. The first upper slant members 112 are formed, respectively, substantially on the same circumference as the first lower slant members 103 installed in the outer peripheral portion of the support member 52 and are disposed at the same pitch as the first lower slant members 103. Lower surfaces of the slopes of the first upper slant members 112 are set to be substantially parallel to the slopes of the facing first lower slant members 103. In other words, the slant surfaces of the first upper slant members 112 are formed to have the same angle as that of the slant surfaces of the first lower slant members 103 in a case where, for example, the first lower slant members 103 are rotated 180 degrees about a horizontal axis. For example, a locking portion 112a is formed on a top portion at the slope of each of the first upper slant members 112 to extend vertically downward by a predetermined height such that the locking portions 112a engage with the locking portions 103a of the first lower slant members 103, respectively.

Figure 25:
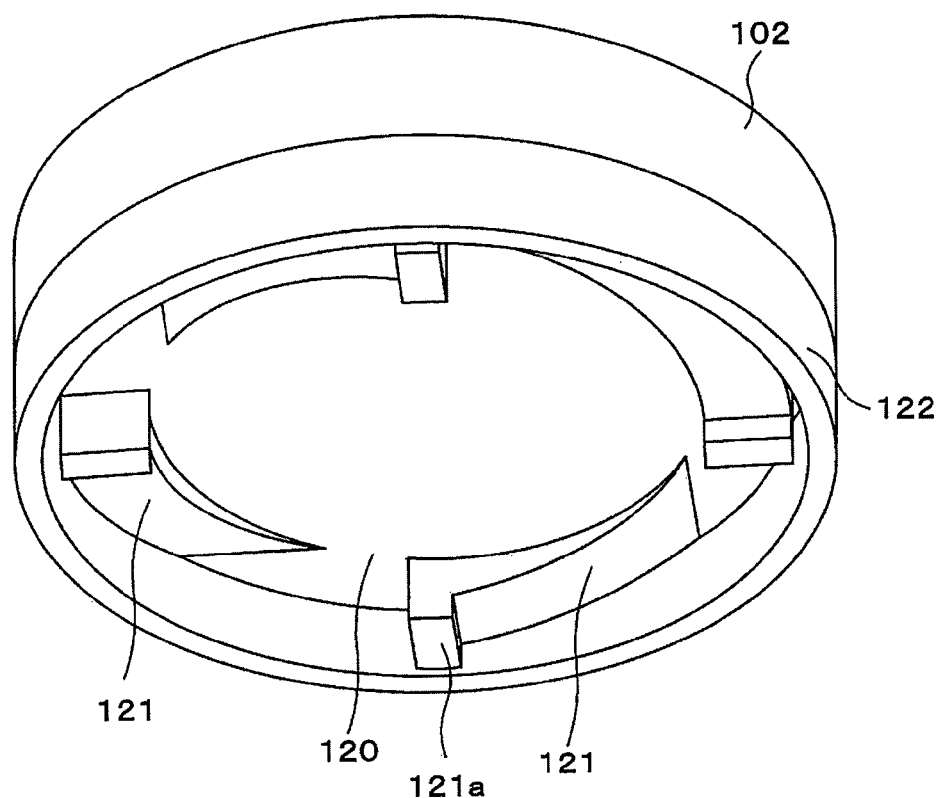
FIG. 25 schematically illustrates a configuration of a polishing member according to another embodiment.

As illustrated in FIG. 25, for example, a lower surface of the polishing member 102 is supported by a second rotating member 120 having a substantially disc-shape which is substantially identical to the shape of the polishing member 102 in a top view. A diameter of the second rotating member 120 is smaller than that of the central opening of the cleaning member 101.

A plurality of second upper slant members 121, each of which has a slope extending in the circumferential direction of the second rotating member 120 at a predetermined angle, is formed in an outer peripheral portion of a rear surface of the second rotating member 120, i.e., a surface of the second rotating member 120 opposite to the polishing member 102. The second upper slant members 121 are formed, respectively, substantially on the same circumference as the second lower slant members 104 installed in the central portion of the support member 52 and are disposed at the same pitch as the second lower slant members 104. Lower surfaces of the slopes of the second upper slant members 121 are set to be substantially parallel to the slopes of the facing second lower slant members 104. In other words, the slant surfaces of the second upper slant members 121 are formed to have the same angle as that of the slant surfaces of the second lower slant members 104 in a case where, for example, the second lower slant members 104 are rotated 180 degrees about a horizontal axis. For example, a locking portion 121a is formed on a top portion of each of the slopes of the second upper slant members 121 to extend vertically downward by a predetermined height such that the locking portions 121a engage with the locking portions 104a of the second lower slant members 104. A friction coefficient between each of the lower slant members 103 and 104 and each of the upper slant members 112 and 121 is set to be smaller than a friction coefficient between the cleaning member 101 and the rear surface of the wafer W and a friction coefficient between the polishing member 102 and the rear surface of the wafer W. In other words, each of the lower slant members 103 and 104 and each of the upper slant members 112 and 121 are formed of a member having a friction coefficient smaller than the friction coefficient between the cleaning member 101 and the rear surface of the wafer W and the friction coefficient between the polishing member 102 and the rear surface of the wafer W. The cam mechanism of the polishing cleaning mechanism 100 is configured by the support member 52 provided with the lower slant members 103 and 104, the first rotating member 110 provided with the first upper slant members 112, and the second rotating member 120 provided with the second upper slant members 121.

A cylindrical partition plate 122 extending vertically downward is installed on an outer side surface of the second rotating member 120. An outer diameter of the partition plate 122 is smaller than a diameter of the opening formed in the central portion of the cleaning member 101 and is set such that the partition plate 122 surrounds the second upper slant members 121.

Figure 26A:
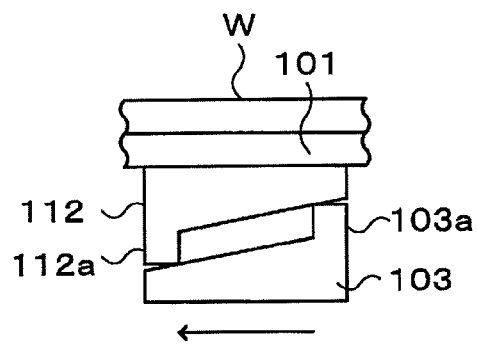
FIGS. 26A and 26B illustrate movement of the cleaning member.
Figure 26B:
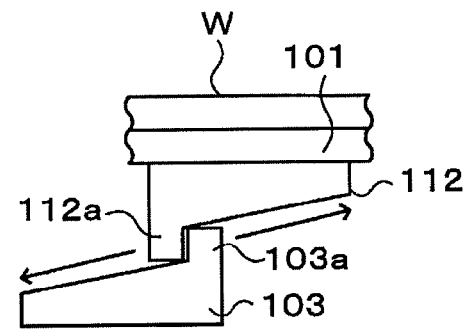
Figure 27A:
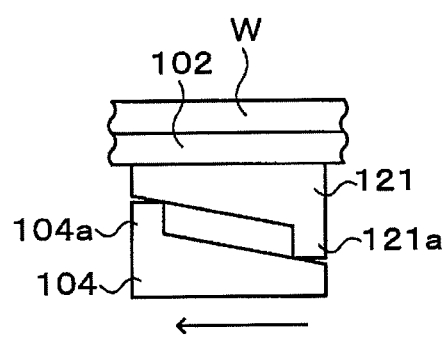
FIGS. 27A and 27B illustrate movement of the polishing member.

The polishing cleaning mechanism 100 in this embodiment provided with the cam mechanism is configured as above. Next, descriptions will be made on the operation of the polishing cleaning mechanism 100. As shown in FIGS. 26A and 27A, for example, the motor 54 is stopped and the polishing cleaning mechanism 100 is not rotated. In this state, the polishing cleaning mechanism 100 is rotated by, e.g., the motor 54, clockwise in a top view (i.e., in the direction indicated by arrows in FIGS. 26A and 27A) with the cleaning member 101 and the polishing member 102 pressed against the rear surface of the wafer W. As described above, the friction coefficient between the first lower slant members 103 and the first upper slant members 112 is set to be smaller than the friction coefficient between the cleaning member 101 and the rear surface of the wafer W and the friction coefficient between the polishing member 102 and the rear surface of the wafer W. Therefore, as shown in FIG. 26B, the first upper slant members 112 slide along-the-upper surfaces of the first lower slant members 103 and move obliquely upward along the slopes of the first lower slant members 103 until the locking portions 103a and 112a engage with each other. On the other hand, the second lower slant members 104 and the second upper slant members 121 have the slant surfaces inclined in the opposite direction to the slant surfaces of the first upper slant members 112 and the first lower slant members 103. Thus, the second lower slant members 104 and the second upper slant members 121 are not changed from the state shown in FIG. 27A. The second lower slant members 104 and the second upper slant members 121 are paused relative to each other when the polishing cleaning mechanism 100 is rotated clockwise. Therefore, if the polishing cleaning mechanism 100 is rotated clockwise when seen in a top view, the cleaning member 101 is moved upward with respect to the support member 52 but the polishing member 102 is not moved with respect to the support member 52. As such, the cleaning member 101 is moved upward relative to the polishing member 102. Thus, by rotating the polishing cleaning mechanism 100 clockwise, it is possible to bring only the cleaning member 101 of the polishing cleaning mechanism 100 into contact with the rear surface of the wafer W, thereby performing a cleaning process.

Figure 27B:
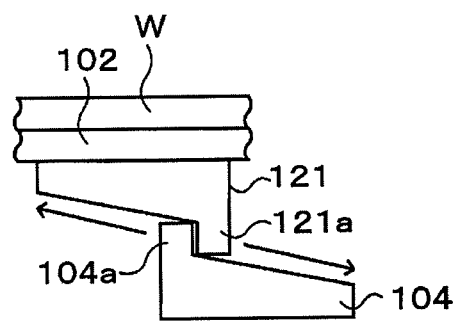

On the other hand, if the polishing cleaning mechanism 100 is rotated counterclockwise when in a top view, the first upper slant members 112 are paused relative to the first lower slant members 103 and are not changed from the state shown in FIG. 26A. As shown in FIG. 27B, the second upper slant members 121 move obliquely upward along the slopes of the second lower slant members 104 until the locking portions 104a and 121a engage with each other. In this case, the polishing member 102 is moved upward with respect to the support member 52 but the cleaning member 101 is not moved with respect to the support member 52. Therefore, the polishing member 102 is moved upward relative to the cleaning member 101. Thus, by rotating the polishing cleaning mechanism 100 counterclockwise, it is possible to bring only the polishing member 102 of the polishing cleaning mechanism 100 into contact with the rear surface of the wafer W, thereby performing a polishing process.

Figure 28:
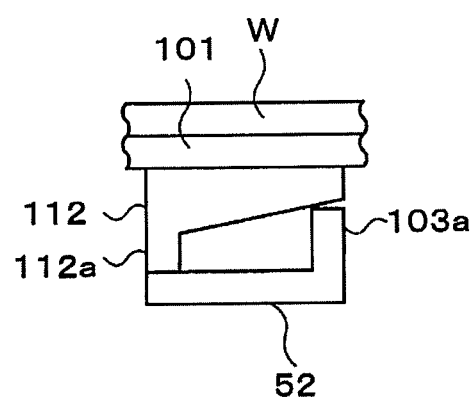
FIG. 28 schematically illustrates a configuration of a cam mechanism, according to another embodiment of the present disclosure.

In the above described embodiment, the slant members 103, 104, 112, and 121 are installed in the support member 52, the first rotating member 110, and the second rotating member 120. However, the configuration of the cam mechanism is not limited to this embodiment. In order to provide the function as the cam mechanism, for example, the slant surface may be formed in one of the support member 52 and the first rotating member 110 as shown in FIG. 28, as long as the locking portions are formed in both of the support member 52 and the first rotating member 110. FIG. 28 illustrates that the first upper slant member 112 is installed at the first rotating member 110 and only the locking portion 103a is installed in the support member 52. Alternatively, the slant member may be formed only at the support member 52. Although the slant members are illustrated to be formed on the entire surfaces of the support member 52 and the rotating members 110 and 120, the function as the cam mechanism is secured if a slant member is formed in at least one location. Therefore, the number and arrangement of the slant members can be set in a suitable manner.

In the embodiment described above, the state of contact of the polishing surfaces and the cleaning surfaces with the rear surface of the wafer W is changed by changing the relative height of the polishing surface of the polishing member 102, the cleaning surface of the cleaning member 101, and the rear surface of the wafer W through the use of the cam mechanism. However, the method of changing the state of contact of the polishing surface and the cleaning surface with the rear surface of the wafer W is not limited to this embodiment.

Figure 29:
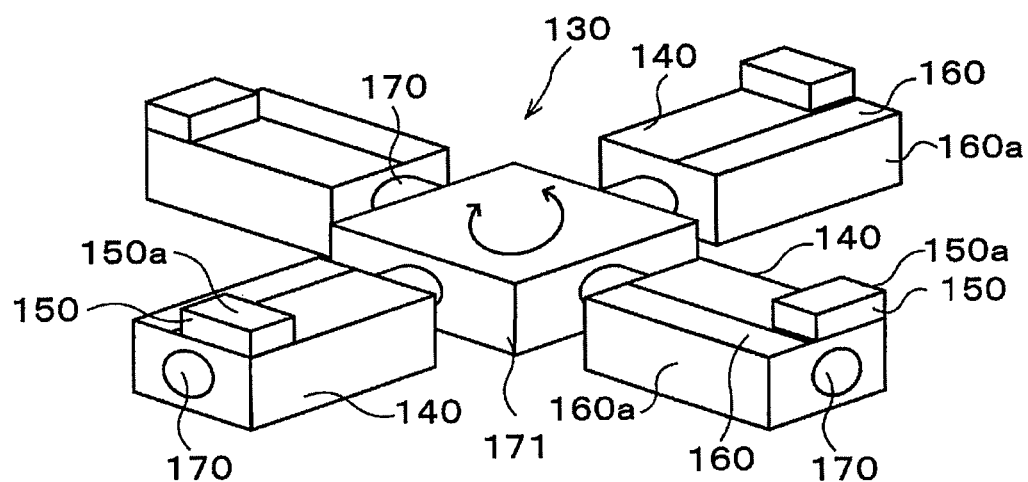
FIG. 29 schematically illustrates a configuration of a polishing cleaning mechanism in a perspective view, according to another embodiment of the present disclosure.

For example, it may be possible to use another polishing cleaning mechanism 130 shown in FIG. 29. The polishing cleaning mechanism 130 is configured as described below. A polishing member 150 and a cleaning member 160 are disposed on each of the support members 140 having a substantially rectangular parallelepiped shape such that an angle between a polishing surface 150a of the polishing member 150 and a cleaning surface 160a of the cleaning member 160 is at a right angle. The support members 140 are supported on the opposite ends of each support shaft 170 which extends in a horizontal direction such that the polishing surface 150a and the cleaning surface 160a make a right angle when seen in the extending direction of each support shaft 170 and such that the support member 140 can rotate about each support shaft 170. For example, bearings (not shown) are interposed between the support members 140 and the support shafts 170.

The support shafts 170 are connected to another support member 171 having, for example, a substantially rectangular parallelepiped shape. The support member 171 is configured such that it can be horizontally rotated about a vertical axis by a rotational drive mechanism including, for example, the motor 54, the shaft 53, and the belt 55. The arrangement of each of the support shafts 170 is adjusted such that the support member 140 having the polishing member 150 and the cleaning member 160 is positioned on a circumference of a circle centered at the support member 171. FIG. 29 illustrates that the two support shafts 170 carrying the support members 140 at the opposite ends thereof are connected to the support member 171. However, the number, length, shape of the support shafts 170 are not limited to this embodiment. It is only necessary that the support members 140 are disposed on the same circumference.

Figure 30:
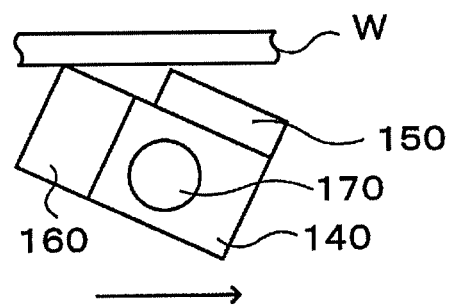
FIG. 30 illustrates that a polishing surface or a cleaning surface is brought into contact with a wafer.
Figure 31:
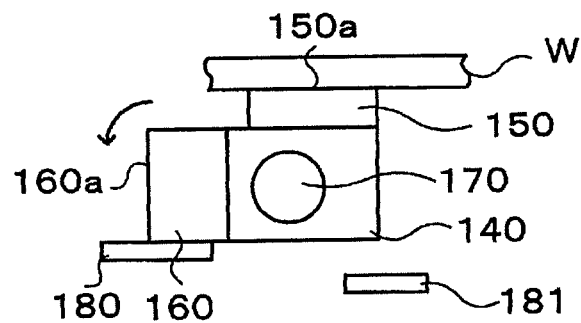
FIG. 31 illustrates that the polishing surface has been brought into contact with the wafer.

In the polishing cleaning mechanism 130, as shown in FIG. 30, if the support member 171 is rotated, for example, counterclockwise (in the direction indicated by an arrow in FIG. 30) in a top view, while at least one of the polishing member 150 and the cleaning member 160 makes contact with the rear surface of the wafer W, the at least one of the polishing member 150 and the cleaning member 160 making contact with the wafer W receives a frictional force from the wafer W. Then, each of the support members 140 is rotated counterclockwise about each of the support shafts 170 as shown in FIG. 31, whereby the polishing surface 150a of the polishing member 150 comes into contact with the rear surface of the wafer W. Thus, the wafer W can be polished by another polishing cleaning mechanism 130.

Figure 32:
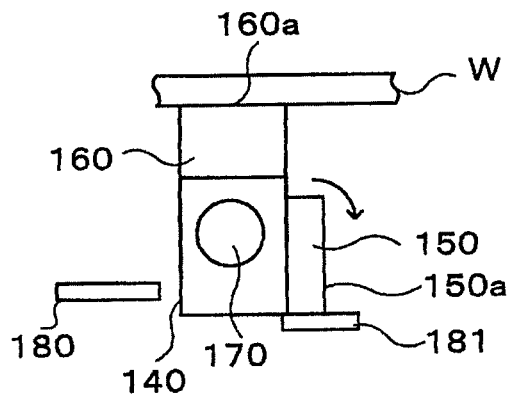
FIG. 32 illustrates that the cleaning surface has been brought into contact with the wafer.

Further, as illustrated in FIG. 31, for example, if the support member 171 is rotated clockwise while the polishing surface 150a makes contact with the rear surface of the wafer W, each of the support members 140 is rotated about each of the support shafts 170 by the frictional force between the polishing member 150 and the wafer W. Therefore, as shown in FIG. 32, the cleaning surface 160a of the cleaning member 160 comes into contact with the rear surface of the wafer W. Thus, the wafer W can be cleaned by the polishing cleaning mechanism 130.

For example, a rotation limiting member 180 which extends along the extension direction of each of the support shafts 170 is installed in the support member 171 as shown in FIGS. 31 and 32. The rotation of each of the support members 140 is limited by the rotation limiting member 180 so that the angle between the cleaning surface 160a and the rear surface of the wafer W should not become more than 90 degrees when the polishing surface 150a makes contact with the rear surface of the wafer W. By installing the rotation limiting member 180, it is possible to prevent each of the support members 140 from being further rotated and to prevent the polishing surface 150a and the rear surface of the wafer W from getting out of contact. In addition, a rotation limiting member 181 for limiting the rotation of each of the support members 140 is also installed in the support member 171 so that the angle between the polishing surface 150a and the rear surface of the wafer W should not become more than 90 degrees when the cleaning surface 160a makes contact with the rear surface of the wafer W. The shape and arrangement of the rotation limiting members 180 and 181 are not limited to the present embodiment and can be configured in a suitable manner.

Figure 33:
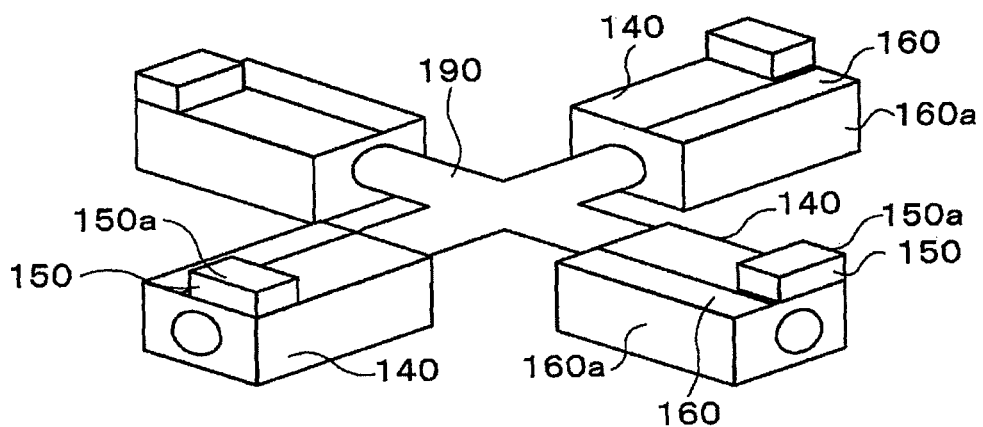
FIG. 33 schematically illustrates a configuration of a polishing cleaning mechanism in a perspective view, according to another embodiment of the present disclosure.

In the above described embodiment, the support shafts 170 are connected to another support member 171. Alternatively, as shown in FIG. 33, the support members 140 may be connected to the end portions of another support shaft 190 having, e.g., a cross shape when seen in a top view.

Figure 34:
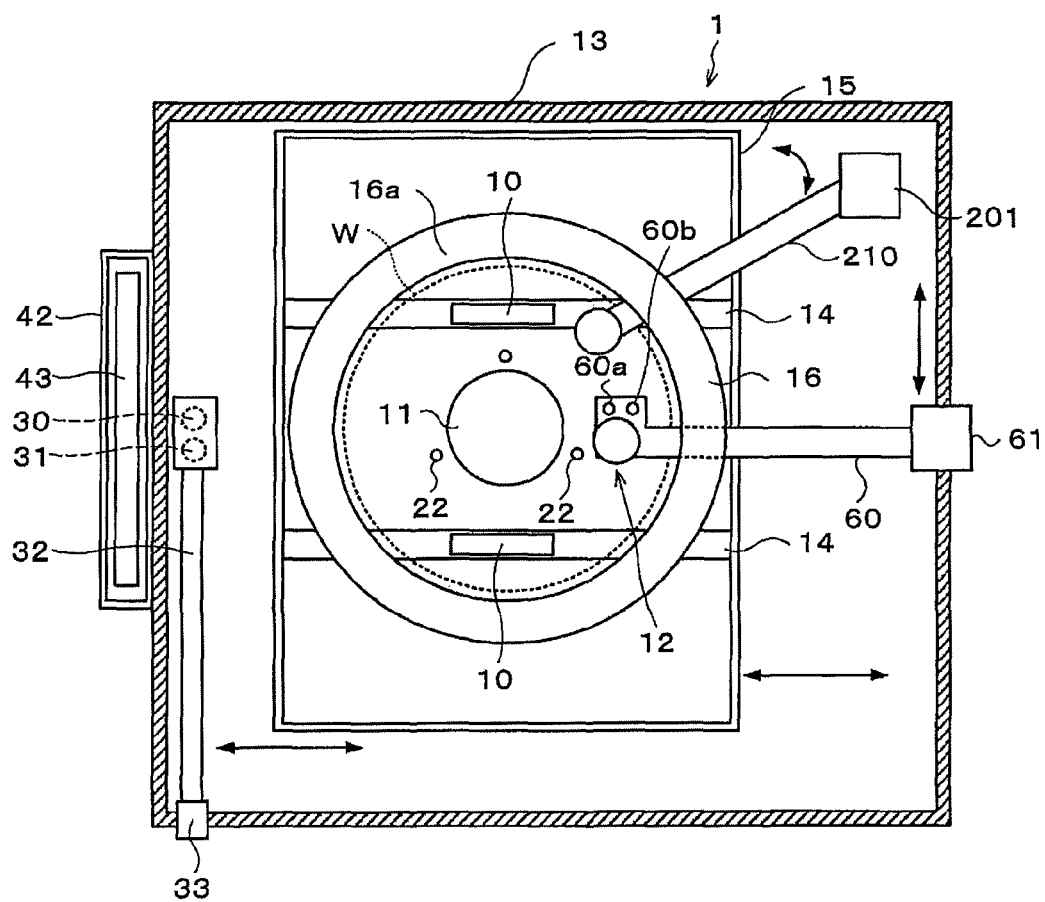
FIG. 34 schematically illustrates a configuration of a substrate processing apparatus in a horizontal sectional view, according to another embodiment of the present disclosure.

In the above described embodiment, a member made of polypropylene or the like is used as the cleaning member. When cleaning the rear surface of the wafer W after the polishing process, it is not necessarily required to perform the cleaning process by bringing the cleaning member into contact with the rear surface of the wafer W. For example, as shown in FIG. 34, another cleaning nozzle 210 for supplying a cleaning liquid on the rear surface of the wafer W may be additionally installed such that the cleaning process can be performed by injecting the cleaning liquid from the cleaning nozzle 210 toward the rear surface of the wafer W. The cleaning nozzle 210 is configured such that it can be swung, for example, by a moving mechanism 201.

The inventors of the present disclosure discovered that in the cleaning process performed after the polishing process, desired cleaning performance can be secured by injecting the cleaning liquid toward the rear surface of the wafer W. Furthermore, it is necessary that only another moving mechanism 201 be installed in the cleaning nozzle 210. For example, there is no need to employ the rotating mechanism such as motor 54 or the like which is employed in the polishing cleaning mechanism 12. Therefore, only the cleaning nozzle 210 can be disposed in the substrate processing apparatus 1.

For example, in the polishing cleaning mechanism 12, after performing the polishing process with the polishing members 50, the cleaning process is performed by the cleaning members 51 via the same route as that of the polishing process. It is therefore necessary for the polishing cleaning mechanism 12 to move twice along the same route. However, for example, if the cleaning process is performed by the cleaning nozzle 210 concurrently with the polishing process, it is possible to finish the cleaning process while the polishing cleaning mechanism 12 moves along the route of the polishing process. Therefore, it is sufficient for the polishing cleaning mechanism 12 to move once along a specified route on the wafer W.

In FIG. 34, the cleaning nozzle 210 is provided with the moving mechanism 201 which differs from the moving mechanism 61. However, for example, the cleaning nozzle 210 may be connected to the moving mechanism 61 such that the cleaning nozzle 210 moves synchronously with the polishing cleaning mechanism 12.

In the above described embodiment, pure water as a cleaning liquid is supplied from the cleaning nozzle 30 or the cleaning liquid nozzle 60a. As an alternative example, a polishing fluid such as ammonia-added water or the like may be supplied in place of the cleaning liquid. In this case, for example, a cleaning liquid supply source for supplying a cleaning liquid to the cleaning nozzle 30 or the cleaning liquid nozzle 60a and a polishing liquid supply source for supplying a polishing liquid may be connected so that they can be switched by a valve. For example, when the polishing process is performed by the polishing members 50, the polishing liquid may be supplied individually from the nozzles 30 and 60a. When the cleaning process is performed by the cleaning members 51, the cleaning liquid may be supplied individually from the nozzles 30 and 60a.

In the above described embodiment, the central portion of the wafer W, namely the region A existing between the attraction pads 10, is first polished and cleaned while the wafer W is attracted and held by the attraction pads 10. Thereafter, the wafer W is delivered to the spin chuck 11 where the outer peripheral portion of the wafer W is polished and cleaned. Depending on the state of the rear surface of the wafer W, for example, only the region A of the wafer W may be polished and cleaned or only the outer peripheral portion of the wafer W may be polished and cleaned. For example, when the wafer W is subjected to a photolithography process, it is sometimes: the case that a resist solution enters a so-called bevel portion of the outer periphery of the wafer W, which may be a source of generation of particles. Therefore, for example, the region A, i.e., the central portion of the wafer W may be subjected to only the cleaning process and the outer peripheral portion of the wafer W may be subjected to the polishing process and the cleaning process.

In this case, for example, when the region A of the wafer W is processed as shown in FIG. 9, for example, the cleaning process may be continuously performed while the wafer W reciprocates in the Y-axis direction. As an alternative example, the cleaning process may be performed when the wafer W is moved toward the negative side in the Y-axis direction. When the wafer W is moved toward the positive side in the Y-axis direction, the cleaning process may be stopped and the wafer W may be rapidly moved. By doing so, it is possible to improve the wafer processing throughput in the substrate processing apparatus 1.

For example, when performing the polishing process and the cleaning process on the wafer W, the rear surface of the wafer W may be first inspected. Based on the inspection result, a portion to be subjected to the polishing process or the cleaning process may be selected. The movement of the moving mechanism 61 or the frame 15 may be controlled by the control unit 200 such that the selected portion is polished or cleaned. In this case, for example, only the polishing process may be performed on a specified portion or only the cleaning process may be performed on the specified portion. A processing range may be suitably decided depending on the inspection result of the wafer W and the polishing process or the cleaning process is selectively performed on the range thus decided. In the inspection of the wafer W, it may be possible to use, for example, a well-known inspection device.

While certain preferred embodiments of the present disclosure have been described with reference to the accompanying drawings, the present disclosure is not limited to these embodiments. It will be apparent to those skilled in the art that different modifications and changes can be conceived without departing from the scope of the idea recited in the claims. It is to be understood that these modifications and changes may well belong to the technical scope of the present disclosure. The present disclosure is not limited to these examples and may employ many different forms. The present disclosure may be applied to a case where the substrate is not a wafer but is other substrate such as a FPD (Flat Panel Display), a mask reticle for a photo mask or the like.

The present disclosure is useful in polishing and cleaning a rear surface of a substrate such as a semiconductor wafer or the like.

According to the present disclosure, it is possible to efficiently perform a polishing process and a cleaning process on a wafer.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A polishing cleaning mechanism configured to be in contact with a part of a rear surface of a substrate which is held in a substrate holding unit for holding the rear surface of the substrate and perform a polishing process and a cleaning process on the rear surface of the substrate, comprising:
　a polishing member including a polishing surface configured to polish the rear surface of the substrate;
　a cleaning member including a cleaning surface configured to clean the rear surface of the substrate;
　a first support member configured to support the polishing member and the cleaning member; and
　a relative movement mechanism configured to move each of the polishing surface of the polishing member and the cleaning surface of the cleaning member relative to the rear surface of the substrate held in the substrate holding unit by rotating the first support member,
　wherein a surface area of the polishing cleaning mechanism facing the substrate is smaller than a surface area of the substrate,
　wherein the polishing member and the cleaning member are disposed on the first support member such that an angle between the polishing surface and the cleaning surface is a right angle,
　wherein the first support member is supported on each of opposite ends of a support shaft, which extends in a horizontal direction, such that the polishing surface and the cleaning surface make a right angle when viewed in an extending direction of the support shaft and the first support member is rotatable about the support shaft, and
　wherein the polishing surface and the cleaning surface are moved relative to the rear surface of the substrate held in the substrate holding unit by horizontally rotating the support shaft about a vertical axis.

2. The mechanism of claim 1, wherein a rotation limiting member configured to limit rotation of the first support member to prevent an angle between the polishing surface of the polishing member and the rear surface of the substrate and an angle between the cleaning surface of the cleaning member and the rear surface of the substrate from exceeding 90 degrees is installed in at least one of the support shaft and the first support member.

3. The mechanism of claim 2, further comprising a second support member configured to support the first support member via the support shaft, and
　wherein the first support member is supported by the second support member such that the first support member is positioned on a circumference of a circle centered at the second support member in a top view.

4. A polishing cleaning mechanism configured to be in contact with a part of a rear surface of a substrate which is held in a substrate holding unit for holding the rear surface of the substrate and perform a polishing process and a cleaning process on the rear surface of the substrate, comprising:
　a polishing member including a polishing surface configured to polish the rear surface of the substrate;
　a cleaning member including a cleaning surface configured to clean the rear surface of the substrate;
　a first support member configured to support the polishing member and the cleaning member; and
　a relative movement mechanism configured to move each of the polishing surface of the polishing member and the cleaning surface of the cleaning member relative to the rear surface of the substrate held in the substrate holding unit by rotating the first support member,
　wherein a surface area of the polishing cleaning mechanism facing the substrate is smaller than a surface area of the substrate, and
　wherein the relative movement mechanism includes:
　　a first rotating member configured to support a surface of the cleaning member opposite to the cleaning surface and rotate relative to the first support member when the first support member rotates;
　　a second rotating member configured to support a surface of the polishing member opposite to the polishing surface and rotate relative to the first support member when the first support member rotates; and
　　a cam mechanism configured to vertically move the first rotating member and the second rotating member relative to each other by rotating the first support member about a vertical axis.

5. A substrate processing apparatus configured to perform a polishing process and a cleaning process on a rear surface of a substrate held in a substrate holding unit for holding the rear surface of the substrate, comprising:
　a polishing cleaning mechanism configured to be in contact with a part of the rear surface of the substrate and perform the polishing process and the cleaning process on the rear surface of the substrate, including:
　　a polishing member including a polishing surface configured to polish the rear surface of the substrate;
　　a cleaning member including a cleaning surface configured to clean the rear surface of the substrate;
　　a first support member configured to support the polishing member and the cleaning member; and
　　a relative movement mechanism configured to move each of the polishing surface of the polishing member and the cleaning surface of the cleaning member relative to the rear surface of the substrate held in the substrate holding unit by rotating the first support member;
　a rotation drive mechanism configured to rotate the first support member about a vertical axis;
　a moving mechanism configured to relatively move the first support member and the substrate held in the substrate holding unit; and
　a control unit configured to execute a control operation such that while at least one of the cleaning member and the polishing member is pressed against the substrate by relatively moving the first support member and the substrate held in the substrate holding unit with the moving mechanism, the first support member is rotated by the rotation drive mechanism to move the polishing surface of the polishing member and the cleaning surface of the cleaning member relative to the rear surface of the substrate held in the substrate holding unit, wherein a surface area of the polishing cleaning mechanism facing the substrate is smaller than a surface area of the substrate.

6. The apparatus of claim 5, wherein a load measuring instrument configured to measure a load is installed between the first support member and the cleaning member, and
wherein the control unit is configured to, based on a measurement result of the load measuring instrument, control the moving mechanism to adjust a load by which the cleaning member is pressed against the substrate.

7. The apparatus of claim 5, wherein the control unit is configured to, based on a result of inspection of the rear surface of the substrate conducted in advance, select a portion of the rear surface of the substrate to be subjected to at least one of the polishing process and the cleaning process and control the moving mechanism to selectively perform at least one of the polishing process and the cleaning process on the selected portion.

8. A substrate processing method for, using the polishing cleaning mechanism of claim 1, performing the polishing process and the cleaning process on the rear surface of the substrate held in the substrate holding unit for holding the rear surface of the substrate, comprising:
performing one of the cleaning process and the polishing process by rotating the first support member in a specified direction while at least one of the polishing surface of the polishing member and the cleaning surface of the cleaning member is in contact with the rear surface of the substrate and by moving the polishing surface of the polishing member and the cleaning surface of the cleaning member relative to the rear surface of the substrate held in the substrate holding unit; and
switching the polishing process and the cleaning process by rotating the first support member in a direction opposite to the specified direction.

9. The method of claim 8, wherein a portion of the rear surface of the substrate to be subjected to at least one of the polishing process and the cleaning process is selected based on a result of inspection of the rear surface of the substrate conducted in advance, and at least one of the polishing process and the cleaning process is selectively performed on the selected portion.

* * * * *